US012646536B2

(12) United States Patent (10) Patent No.: US 12,646,536 B2
Karda et al. (45) Date of Patent: Jun. 2, 2026

(54) MEMORY DEVICE INCLUDING 2-TRANSISTOR MEMORY CELL STRUCTURE FOR NEURAL NETWORK

(71) Applicant: Micron Technology, Inc., Boise, ID (US)

(72) Inventors: Kamal M. Karda, Boise, ID (US); Karthik Sarpatwari, Boise, ID (US); Alessandro Calderoni, Boise, ID (US); Durai Vishak Nirmal Ramaswamy, Boise, ID (US); Yunfei Gao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 18/778,321

(22) Filed: Jul. 19, 2024

(65) Prior Publication Data

US 2025/0029638 A1 Jan. 23, 2025

Related U.S. Application Data

(60) Provisional application No. 63/527,951, filed on Jul. 20, 2023.

(51) Int. Cl.
*G11C 5/06* (2006.01)
*H10B 12/00* (2023.01)
*H10W 20/41* (2026.01)

(52) U.S. Cl.
CPC ........... *G11C 5/063* (2013.01); *H10B 12/312* (2023.02); *H10B 12/485* (2023.02); *H10B 12/488* (2023.02); *H10W 20/435* (2026.01)

(58) Field of Classification Search
CPC ... G11C 5/063; G11C 7/1006; H01L 23/5283; H10B 12/312; H10B 12/485; H10B 12/488; H10B 12/00; H10B 41/70
USPC .............................................. 365/63, 230.06
See application file for complete search history.

(56) References Cited

U.S. PATENT DOCUMENTS

| | | | | |
|---|---|---|---|---|
| 9,117,506 | B2 * | 8/2015 | Hsu ........................... | G11C 7/18 |
| 2003/0123303 | A1 * | 7/2003 | Kamei .............. | G11C 16/0475 |
| | | | | 365/200 |
| 2010/0265766 | A1 * | 10/2010 | Lue ........................ | H10B 43/10 |
| | | | | 257/326 |
| 2012/0074467 | A1 * | 3/2012 | Abe ....................... | H10B 41/10 |
| | | | | 257/E23.141 |

(Continued)

*Primary Examiner* — Michael T Tran
(74) *Attorney, Agent, or Firm* — Schwegman Lundberg & Woessner, P.A.

(57) ABSTRACT

Some embodiments include apparatuses and methods of operating the apparatuses. One of the apparatuses includes a first memory cell and a second memory cell, each of the first and second memory cells including a first transistor including a first region and a first charge storage structure separated from the first region; a second transistor including a second region formed over the first charge storage structure; a first data line coupled to the first memory cell configured to provide a first sum based on current on the first data line during a memory operation; a second data line coupled to the second memory cell configured to provide a second sum based on current on the second data line during the memory operation; and an output circuit to provide output information based on values of the first and second sums.

20 Claims, 18 Drawing Sheets

(56)                   References Cited

U.S. PATENT DOCUMENTS

| | | | | |
|---|---|---|---|---|
| 2013/0307054 | A1* | 11/2013 | Yasuda | H10D 30/681 |
| | | | | 257/326 |
| 2014/0103346 | A1* | 4/2014 | Yamazaki | H10D 30/6739 |
| | | | | 257/66 |
| 2015/0063025 | A1* | 3/2015 | Takekida | G11C 16/12 |
| | | | | 257/319 |
| 2017/0358367 | A1* | 12/2017 | Givant | G11C 16/0466 |
| 2020/0342932 | A1* | 10/2020 | Bennett | G11C 11/4096 |
| 2021/0027828 | A1* | 1/2021 | Yamazaki | H10B 99/00 |

* cited by examiner

200

900

$905_3$

| MEMORY CELL $930_3$ | MEMORY CELL $931_3$ | MEMORY CELL $932_3$ | MEMORY CELL $933_3$ | 953 |

$905_2$

| MEMORY CELL $930_2$ | MEMORY CELL $931_2$ | MEMORY CELL $932_2$ | MEMORY CELL $933_2$ | 952 |

$905_1$

| MEMORY CELL $930_1$ | MEMORY CELL $931_1$ | MEMORY CELL $932_1$ | MEMORY CELL $933_1$ | 951 |

$905_0$

| MEMORY CELL $930_0$ | MEMORY CELL $931_0$ | MEMORY CELL $932_0$ | MEMORY CELL $933_0$ | 950 |

| MEMORY CELL $933_3$ | MEMORY CELL $923_3$ | MEMORY CELL $913_3$ | 953 |
| MEMORY CELL $933_2$ | MEMORY CELL $923_2$ | MEMORY CELL $913_2$ | 952 |
| MEMORY CELL $933_1$ | MEMORY CELL $923_1$ | MEMORY CELL $913_1$ | 951 |
| MEMORY CELL $933_0$ | MEMORY CELL $923_0$ | MEMORY CELL $913_0$ | 950 |

Figure 10:
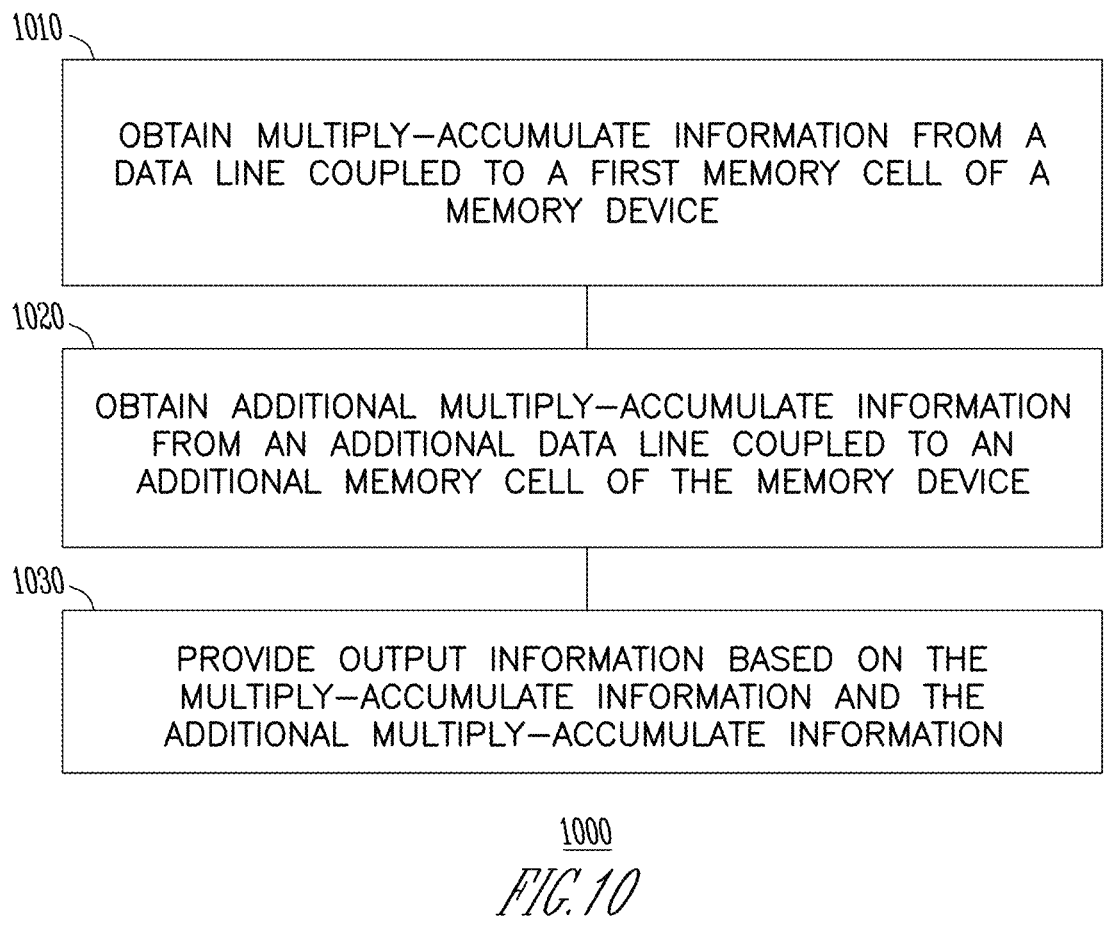

OBTAIN MULTIPLY—ACCUMULATE INFORMATION FROM A DATA LINE COUPLED TO A FIRST MEMORY CELL OF A MEMORY DEVICE

1020

OBTAIN ADDITIONAL MULTIPLY—ACCUMULATE INFORMATION FROM AN ADDITIONAL DATA LINE COUPLED TO AN ADDITIONAL MEMORY CELL OF THE MEMORY DEVICE

1030

PROVIDE OUTPUT INFORMATION BASED ON THE MULTIPLY—ACCUMULATE INFORMATION AND THE ADDITIONAL MULTIPLY—ACCUMULATE INFORMATION

MEMORY DEVICE INCLUDING 2-TRANSISTOR MEMORY CELL STRUCTURE FOR NEURAL NETWORK

PRIORITY APPLICATION

This application claims the benefit of priority to U.S. Provisional Application Ser. No. 63/527,951, filed Jul. 20, 2023, which is incorporated herein by reference in its entirety.

BACKGROUND

Memory devices are widely used in computers and many other electronic items to store information. Memory devices are generally categorized into two types: volatile memory devices and non-volatile memory devices. In a volatile memory device, information stored in the memory cells is lost if the power supply is disconnected from the memory device. In a non-volatile memory device, information stored in the memory cells is retained even if the power supply is disconnected from the memory device. Examples of volatile memory devices include static random-access memory (SRAM) devices and dynamic random-access memory (DRAM) devices. Examples of non-volatile memory devices include flash memory devices.

The description herein involves memory devices that can be configured to implement a neural network. Neural networks are networks that can process information by modeling a network of neurons, such as neurons in a human brain, to process information (e.g., stimuli) which has been sensed in a particular environment. Some conventional memory devices have been used to implement neuron networks. However, implementation of such neural networks using some conventional memory devices may face challenges associated with area efficiency or performance, or both.

BRIEF DESCRIPTION OF THE DRAWINGS

FIG. 9A, FIG. 9B, and FIG. 9C show different views of a structure of a memory device including multiple decks of memory cells, according to some embodiments described herein.

FIG. 10 is a flowchart for a method of obtaining multiply-accumulate information in a memory device, according to some embodiments described herein.

DETAILED DESCRIPTION

The embodiments disclosed herein involve a memory device that can be configured to implement a neural network. Many attempts have been made to implement neural networks in memory devices. For example, in some previous implementations of neural networks, memory cells have operated to emulate a number of neural models to facilitate one or more neural network operating characteristics in a memory. The embodiments disclosed herein improve upon previous approaches. An example embodiment described herein includes a memory device having a compact structure in comparison to some conventional memory devices used to facilitate neural network operations. In an example, a described memory device includes 2-T memory cells and memory array structure that can provide improved area efficiency and memory performance associated with implementation of neural networks. Other improvements and benefits of the described memory device and its variations are discussed below with reference to FIG. 1 through FIG. 9C.

Figure 1:
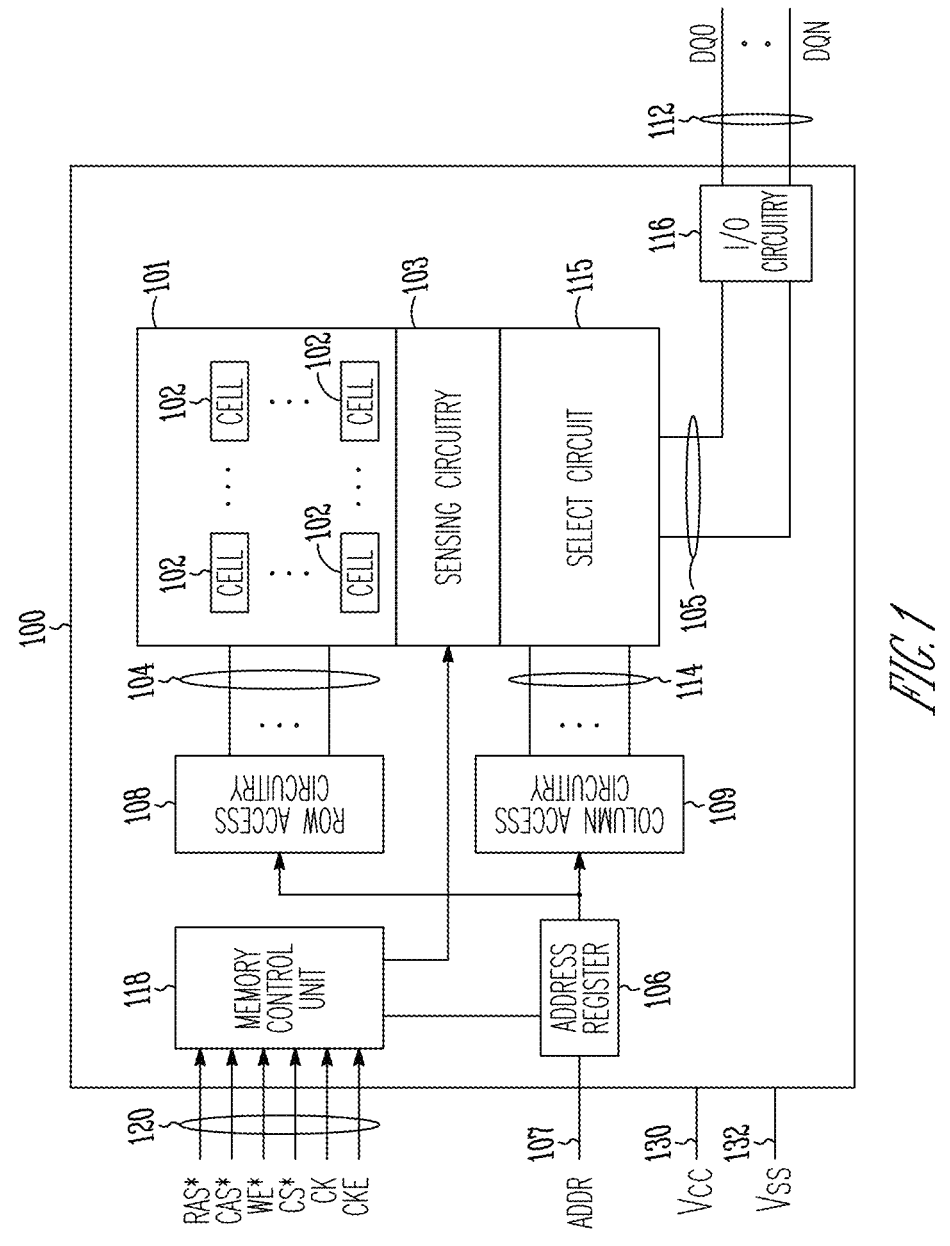
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array (or memory arrays) 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2A through FIG. 9C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device. FIG. 1 shows memory control unit 118 as part of (e.g., located inside) memory device 100. However, part of control unit 118 can be located outside memory device 100 (e.g., located in a memory controller (e.g., a controller chip)) external to memory device 100. For example, part of memory control unit 118 that is configured to perform operation to obtain multiply-accumulate information (described below) may be located in a memory controller (e.g., a memory controller chip) external to memory device 100.

As shown in FIG. 1, memory device 100 can include lines (e.g., global data lines) 112 that can carry signals DQO through DQN. In a read operation, the value (e.g., "0" or "1") of information (read from memory cells 102) provided to lines 112 (in the form of signals DQO through DQN) can be based on the values of the signals on data lines 105. In a write operation, the value (e.g., "0" or "1") of information provided to data lines 105 (to be stored in memory cells 102) can be based on the values of signals DQO through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR on lines (e.g., select lines) 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2A through FIG. 9C.

Figure 2A:
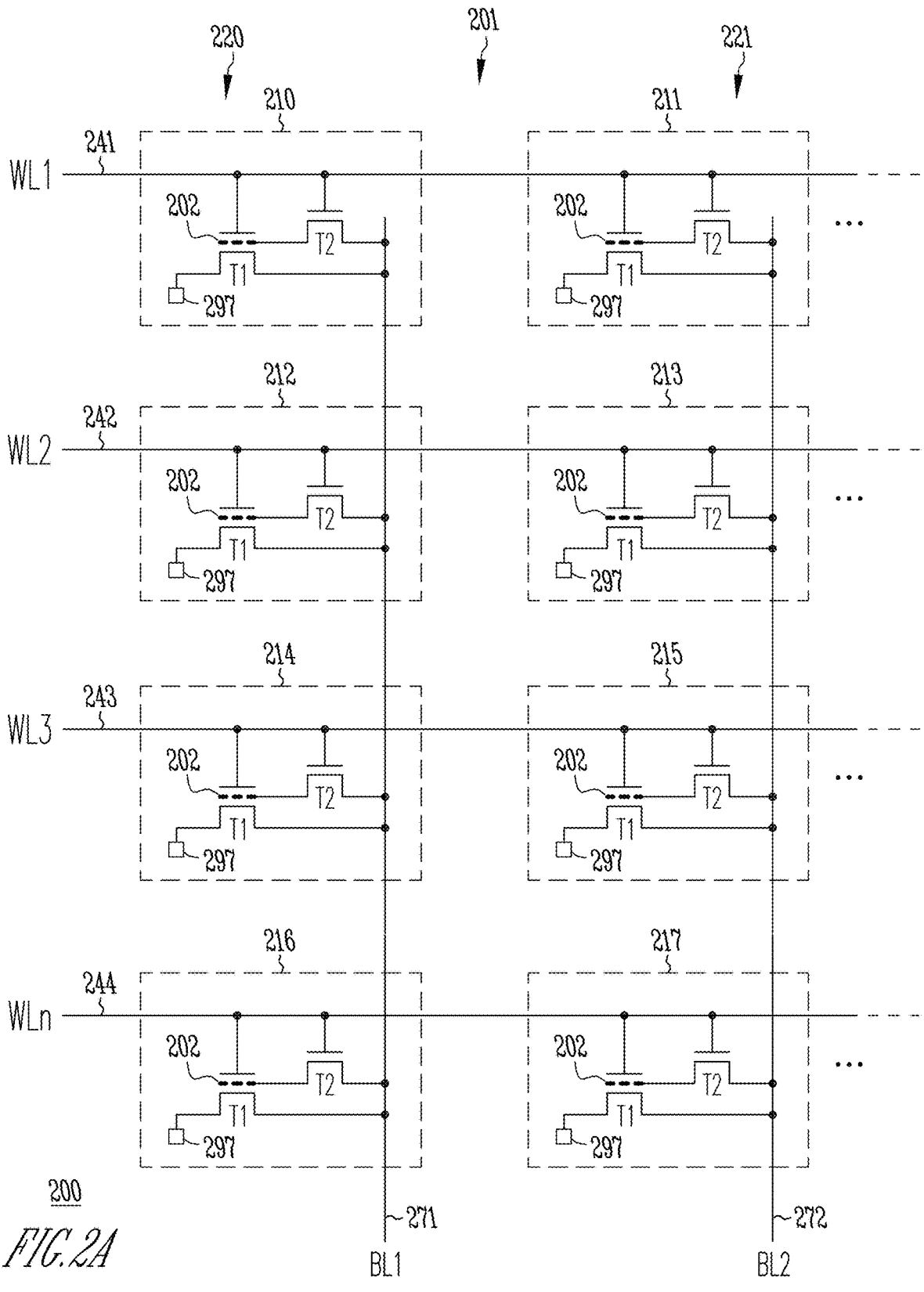
FIG. 2A shows a schematic diagram of a portion of a memory device including a memory array of two-transistor (2T) memory cells, according to some embodiments described herein.

FIG. 2A shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2A, memory device 200 can include memory cells 210 through 217, which are volatile memory cells (e.g., DRAM cells). For simplicity, similar or identical elements among memory cells 210 through 217 are given the same labels.

Each of memory cells 210 through 217 can include two transistors T1 and T2. Thus, each of memory cells 210 through 217 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based structure). As shown in FIG. 2A, each of memory cells 210 through 217 can include a charge storage structure 202, which can include the floating gate of transistor T1. Charge storage structure 202 can form the memory element of a respective memory cell among memory cells 210 through 217. Charge storage structure 202 can store charge. The value (e.g., "0" or "1") of information stored in a particular memory cell among memory cells 210 through 217 can be based on the amount of charge in charge storage structure 202 of that particular memory cell. For example, the value of information stored in a particular memory cell among memory cells 210 through 217 can be "0" or "1" (if each memory cell is configured as a single-bit memory cell) or "00", "01", "10", "11" (or other multi-bit values) if each memory cell is configured as a multi-bit memory cell.

As shown in FIG. 2A, transistor T2 (e.g., the channel region of transistor T2) of a particular memory cell among memory cells 210 through 217 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271 or 272) and charge storage structure 202 of a particular memory cell through transistor T2 (e.g., through the channel region of transistor T2) of the particular memory cell.

Memory cells 210 through 217 can be arranged in memory cell groups 220 and 221. FIG. 2A shows two memory cell groups (e.g., 220 and 221) as an example. However, memory device 200 can include more than two memory cell groups. Memory cell groups 220 and 221 can include the same number of memory cells. For example, memory cell group 220 can include memory cells 210, 212, 214, and 216, and memory cell group 221 can include memory cells 211, 213, 215, and 217. FIG. 2A shows four memory cells in each of memory cell groups 220 and 221 as an example. The number of memory cells in memory cell groups 220 and 221 can be different from four.

Memory device 200 can perform a write operation to store information in memory cells 210 through 217, and a read operation to read (e.g., sense) information from memory cells 210 through 217. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2A, memory device 200 can include access lines (e.g., word lines) 241, 242, 243, and 244 that can carry respective signals (e.g., word line signals) WL1, WL2, WL3, and WLn. Access lines 241, 242, 243, and 244 can be used to access both memory cell groups 220 and 221. In the physical structure of memory device 200, each of access lines 241, 242, 243, and 244 can be structured as (can be formed from) at least one conductive line (one conductive line or multiple conductive lines where the multiple conductive lines can be electrically coupled (e.g., shorted) to each other).

Access lines 241, 242, 243, and 244 form control gates for respective memory cells (e.g., memory cells 210 through 217 in FIG. 2A) of memory device 200 to control access to the memory cells during an operation (e.g., read or write operation) of memory device 200.

Access lines 241, 242, 243, and 244 can be selectively activated (e.g., activated one at a time) during an operation (e.g., read or write operation) of memory device 200 to access a selected memory cell (or selected memory cells) among memory cells 210 through 217. A selected memory cell can be referred to as a target memory cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 271 or 272) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate (not labeled in FIG. 2A) of each of transistors T1 and T2 can be part of a respective access line (e.g., a respective word line). As shown in FIG. 2A, the gate of each of transistors T1 and T2 of memory cell 210 can be part of access line 241. The gate of each of transistors T1 and T2 of memory cell 211 can be part of access line 241. For example, in the physical structure of memory device 200, four different portions of a conductive material (e.g., four different portions of a continuous piece of metal or polysilicon) that forms access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (e.g., four different portions of a continuous piece of metal or polysilicon) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (e.g., four different portions of a continuous piece of metal or polysilicon) that form access line 243 can form the gates (e.g., four gates) of transistors T1 and T2 of memory cell 214 and the gates of transistors T1 and T2 of memory cell 215, respectively.

The gate of each of transistors T1 and T2 of memory cell 216 can be part of access line 244. The gate of each of transistors T1 and T2 of memory cell 217 can be part of access line 244. For example, in the structure of memory device 200, four different portions of a conductive material (e.g., four different portions of a continuous piece of metal or polysilicon) that forms access line 244 can form the gates (e.g., four gates) of transistors T1 and T2 of memory cell 216 and the gates of transistors T1 and T2 of memory cell 217, respectively.

In this description, a material can include a single material or a combination of multiple materials. A conductive material can include a single conductive material or combination of multiple conductive materials.

Memory device 200 can include data lines (e.g., bit lines) 271 and 272 that can carry respective signals (e.g., bit line signals) BL1 and BL2. During a read operation, memory device 200 can use data line 271 to obtain information read (e.g., sensed) from a selected memory cell of memory cell group 220, and data line 272 to read information from a selected memory cell of memory cell group 221. During a write operation, memory device 200 can use data line 271 to provide information to be stored in a selected memory cell of memory cell group 220, and data line 272 to provide information to be stored in a selected memory cell of memory cell group 221.

Memory device 200 can include a connection 297 coupled to each of memory cells 210 through 217. Connection 297 can be structured from a conductive plate (e.g., a layer of conductive material) that can be coupled to (or can be part of) a ground connection (e.g., ground terminal) of memory device 200. In the structure of memory device 200, connection 297 can be part of a common plate (e.g., common conductive plate) or the memory cells within a memory array or between different memory array of memory device 200.

As an example, connection 297 can be part of a common conductive structure (e.g., a common conductive plate) that can be formed on a level of memory device 200 that is under the memory cells (e.g., memory cells 210 through 217) of memory device 200. In this example, the elements (e.g., part of transistors T1 and T2 or the entire transistors T1 and T2) of each of the memory cells (e.g., memory cells 210 through 217) of memory device 200 can be formed (e.g., formed vertically) over the common conductive structure (e.g., a common conductive plate) and electrically coupled to the common conductive structure.

In another example, connection 297 can be part of separate conductive structures (e.g., separate conductive strips) that can be formed on a level of memory device 200 that is under the memory cells (e.g., memory cells 210 through 217) of memory device 200. In this example, the elements (e.g., part of transistors T1 and T2) of each of the memory cells (e.g., memory cells 210 through 217) of memory device 200 can be formed over (e.g., formed vertically) respective conductive structures (e.g., respective conductive strips) among the separate conductive structures (e.g., separate conductive strips) and electrically coupled to the respective conductive structures.

As shown in FIG. 2A, transistor T1 (e.g., the channel region of transistor T1) of a particular memory cell among memory cells 210 through 217 can be electrically coupled to (e.g., directly coupled to) connection 297 and electrically coupled to (e.g., directly coupled to) a respective data line (e.g., data line 271 or 272). Thus, a circuit path (e.g., current path) can be formed between a respective data line (e.g., data line 271 or 272) and connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group 220, a read path of a particular memory cell (e.g., memory cell 210, 212, 214, or 216) can include a current path (e.g., read current path) through a channel region of transistor T1 of that particular memory cell, data line 271, and connection 297. In memory cell group 221, a read path of a particular memory cell (e.g., memory cell 211, 213, 215, or 217) can include a current path (e.g., read current path) through a channel region of transistor T1 of that particular memory cell, data line 272, and connection 297. In the example where transistor T1 is a PFET (e.g., a PMOS), the current in the read path (e.g., during a read operation) can include a hole conduction (e.g., hole conduction in the direction from data line 271 to connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group 220, a write path of a particular memory cell can include transistor T2 (e.g., can include a write current path through a channel region of transistor T2) of that particular memory cell and data line 271. In memory cell group 221, a write path of a particular memory cell (e.g., memory cell 211, 213, 215, or 217) can include transistor T2 (e.g., can include a write current path through a channel region of transistor T2) of that particular memory cell and data line 272. In the example where transistor T2 is an NFET (e.g., NMOS), the current in a write path (e.g., during a write operation) can include an electron conduction (e.g., electron conduction in the direction from data line 271 to charge storage structure 202) through the channel region (e.g., n-channel region) of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1", where Vt1 for state "0"=0V (or alternatively Vt1 for state "0">0V), and Vt1<Vt2.

During a read operation, memory cells of different memory cell groups (e.g., memory cell groups 220 and 221) that share the same access line (e.g., access line 241, 242, 243, or 244) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215. Memory cells 216 and 217 can be concurrently selected during a read operation to read (e.g., concurrently read) information from memory cells 216 and 217.

The value of information read from the selected memory cell of memory cell group 220 during a read operation can be determined based on the value of a current detected (e.g., sensed) from a read path (described above) that includes data line 271, transistor T1 of the selected memory cell (e.g., memory cell 210, 212, 214, or 216), and connection 297. The value of information read from the selected memory cell of memory cell group 221 during a read operation can be determined based on the value of a current detected (e.g., sensed) from a read path that includes data line 272, transistor T1 of the selected memory cell (e.g., memory cell 211, 213, 215, or 217), and connection 297.

Memory device 200 can include detection circuitry (not shown) that can operate during a read operation to detect (e.g., sense) a current (e.g., current I1, not shown) on a read path that includes data line 271, and detect a current (e.g., current I2, not shown) on a read path that includes data line 272. The value of the detected current can be based on the value of information stored in the selected memory cell. For example, depending on the value of information stored in the selected memory cell of memory cell group 220, the value of the detected current (e.g., the value of current I1) on data line 271 can be zero or greater than zero. Similarly, depending on the value of information stored in the selected memory cell of memory cell group 221, the value of the detected current (e.g., the value of current I2) on data line 272 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, 214, and 216 of memory cell group 220 can be selected one at a time during a write operation to store information in the selected memory cell (e.g., one of memory cell 210, 212, 214, and 216 in this example). In another example, memory cells 211, 213, 215, and 217 of memory cell group 221 can be selected one at a time during a write operation to store information in the selected memory cell (e.g., one of memory cell 211, 213, 215, and 217 in this example).

During a write operation, memory cells of different memory cell groups (e.g., memory cell groups 220 and 221) that share the same access line (e.g., access line 241, 242, 243, or 244) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215. Memory cells 216 and 217 can be concurrently selected during a write operation to store (e.g., concurrently store) information in memory cells 216 and 217.

Information to be stored in a selected memory cell of memory cell group 220 during a write operation can be provided through a write path (described above) that includes data line 271 and transistor T2 of the selected memory cell (e.g., memory cell 210, 212, 214, or 216). Information to be stored in a selected memory cell of memory cell group 221 during a write operation can be provided through a write path (described above) that includes data line 272 and transistor T2 of the selected memory cell (e.g., memory cell 211, 213, 215, or 217). As described above, the value (e.g., binary value) of information stored in a particular memory cell among memory cells 210 through 217 can be based on the amount of charge in the charge storage structure 202 of that particular memory cell.

In a write operation, the amount of charge in the charge storage structure 202 of a selected memory cell can be changed (to reflect the value of information stored in the selected memory cell) by applying a voltage on a write path that includes transistor T2 of that particular memory cell and the data line (e.g., data line 271 or 272) coupled to that particular memory cell. For example, a voltage having one value (e.g., 0V) can be applied on data line 271 (e.g., provide 0V to signal BL1) if information to be stored in a selected memory cell among memory cells 210, 212, 214, and 216 has one value (e.g., "0"). In another example, a voltage having another value (e.g., a positive voltage) can be applied on data line 271 (e.g., provide a positive voltage to signal BL1) if information to be stored in a selected memory cell among memory cells 210, 212, 214, and 216 has another value (e.g., "1"). Thus, information can be stored (e.g., directly stored) in the charge storage structure 202 of a particular memory cell by providing the information to be stored (e.g., in the form of a voltage) on a write path (that includes transistor T2) of that particular memory cell.

Figure 2B:
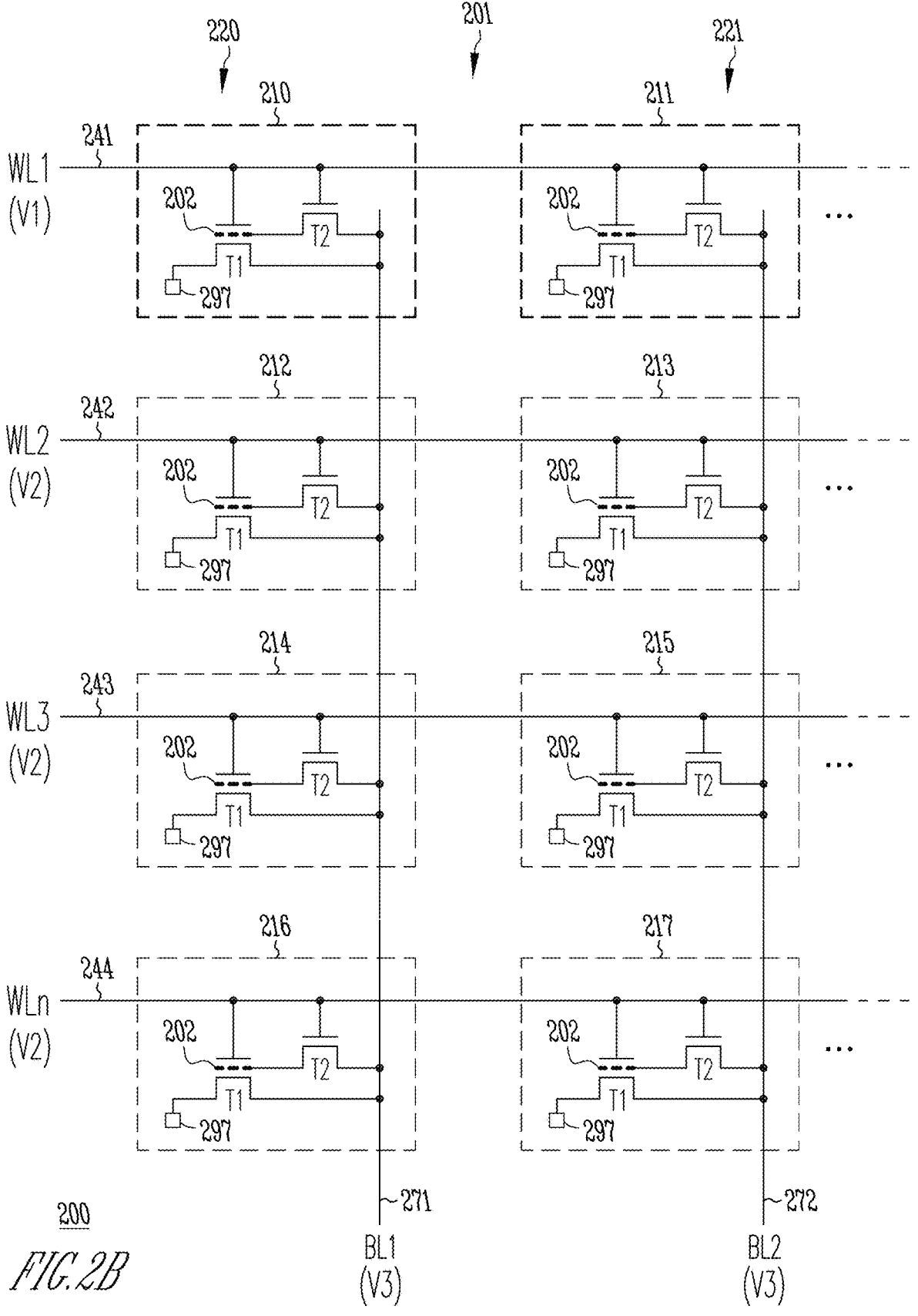
FIG. 2B shows the memory device of FIG. 2A, including example voltages used during a read operation of the memory device, according to some embodiments described herein.

FIG. 2B shows memory device 200 of FIG. 2A including example voltages V1, V2, and V3 used during a read operation of memory device 200, according to some embodiments described herein. The example of FIG. 2B assumes that memory cells 210 and 211 are selected memory cells (e.g., target memory cells) during a read operation to read (e.g., to sense) information stored (e.g., previously stored) in memory cells 210 and 211. Memory cells 212 through 217 are assumed to be unselected memory cells. This means that memory cells 212 through 217 are not accessed, and information stored in memory cells 212 through 217 is not read while information is read from memory cells 210 and 211 in the example of FIG. 2B. In this example, access line 241 can be called a selected access line (e.g., selected word line), which is the access line associated with (e.g., coupled to) selected memory cells (e.g., memory cells 210 and 211 in this example). In this example, access lines 242, 243, and 244 can be called unselected access lines (e.g., unselected word line), which are the access lines associated with (e.g., coupled to) unselected memory cells (e.g., memory cells 212 through 217 in this example).

In FIG. 2B, voltages V1, V2, and V3 can represent different voltages applied to respective access lines 241, 242, 243, and 244 and data lines 271 and 272 during a read operation of memory device 200. Voltage V1 can be applied to the selected access line (e.g., access line 241). In a read operation, voltage V2 can be applied to the unselected access lines (e.g., access lines 242, 243, and 244).

Voltages V1, V2, and V3 can have different values. As an example, voltages V1, V2, and V3 can have values –1V, 0V, and 0.5V, respectively. The specific values of voltages used in this description are only example values. Different values may be used. For example, voltage V1 can have a negative value range (e.g., the value of voltage V1 can be from –3V to –1V).

In the read operation shown in FIG. 2B, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value such that transistors T1 and T2 of each of memory cells 212 through 217 (unselected memory cells in this example) are turned off (e.g., kept off). Voltage V3 can have a value such that a current (e.g., read current) may be formed on a read path that includes data line 271 and transistor T1 of memory cell 210, and a read path (a separate read path) that includes data line 272 and transistor T1 of memory cell 212. This allows a detection of current on the read paths (e.g., on respective data lines 271 and 272) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 2B, the value of the detected currents on data lines 271 and 272 can be translated into the values of information read from memory cells 210 and 211, respectively.

In the read operation shown in FIG. 2B, the voltages applied to respective access lines 241, 242, 243, and 244 can cause transistors T1 and T2 of each of memory cells 212 through 217, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 217) of memory device 200 is configured (e.g., structured) such that the threshold voltage of transistor T1 is less than zero (e.g., Vt1<–1V) regardless of the value (e.g., the state) of information stored in a respective memory cell 210, then transistor T1 of memory cell 210, in this example, can turn on and conduct a current on data line 271 (through transistor T1 of memory cell 210). In this example, transistor T1 of memory cell 211 can also turn on and conduct a current on data line 272 (through transistor T1 of memory cell 211). Memory device 200 can determine the value of information stored in memory cells 210 and 211 based on the value of the currents on data lines 271 and 272, respectively. As described above, memory device 200 can include detection circuitry to measure the value of currents on data lines 271 and 272 during a read operation.

Figure 2C:
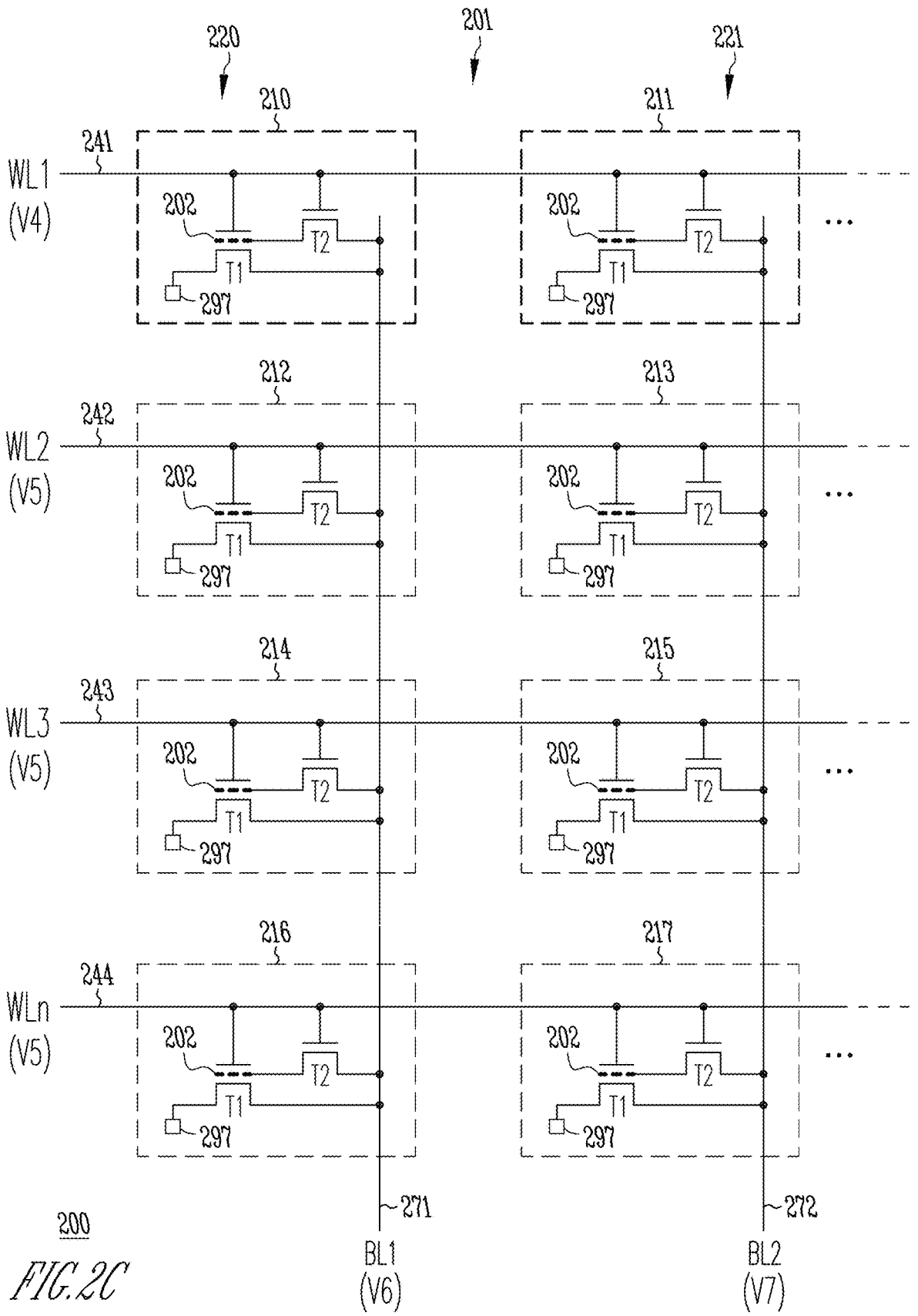
FIG. 2C shows the memory device of FIG. 2A, including example voltages used during a write operation of the memory device, according to some embodiments described herein.

FIG. 2C shows memory device 200 of FIG. 2A including example voltages V4, V5, V6, and V7 used during a write operation of memory device 200, according to some embodiments described herein. The example of FIG. 2C assumes that memory cells 210 and 211 are selected memory cells (e.g., target memory cells) during a write operation to store information in memory cells 210 and 211. Memory cells 212 through 217 are assumed to be unselected memory cells. This means that memory cells 212 through 217 are not accessed and information is not to be stored in memory cells 212 through 217 while information is stored in memory cells 210 and 211 in the example of FIG. 2C.

In FIG. 2C, voltages V4, V5, V6, and V7 can represent different voltages applied to respective access lines 241, 242, 243, and 244 and data lines 271 and 272 during a write operation of memory device 200. In a write operation, voltage V4 can be applied to the selected access line (e.g., access line 241). Voltage V5 can be applied to the unselected access lines (e.g., access lines 242, 243, and 244).

Voltages V4, V5, V6, and V7 can have different values. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+ (e.g., V+ is a positive voltage (e.g., from 1V to 3V)) if information to be stored in each memory cell 210 and 211 is "1".

In another example, the values of voltages V6 and V7 can be different (e.g., V6 V7) if the memory cells 210 and 211 are to store information having different values. As an example, V6=0V if "0" is to be stored in memory cell 210, and V7=V+(e.g., V+ is a positive voltage (e.g., from 1V to 3V)) if "1" is to be stored in memory cell 211. As another example, V6=V+(e.g., V+ is a positive voltage (e.g., from 1V to 3V)) if "1" is to be stored in memory cell 210, and V7=0V if "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 271 or 272) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 2C, voltage V5 can have a value (e.g., V5=0V or V5<0V), such that transistors T1 and T2 of each of memory cells 212 through 217 (unselected memory cells, in this example) are turned off (e.g., kept off). Voltage V4 can have a value (e.g., V4>0V) to turn on transistor T2 of each of memory cells 210 and 211 (selected memory cells in this example) and form a write path between charge storage structure 202 of memory cell 210 and data line 271, and a write path between charge storage structure 202 of memory cell 211 and data line 272. A current (e.g., write current) may be formed between charge storage structure 202 of memory cell 210 (selected memory cell) and data line 271. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272. This current can affect (e.g., change) the amount of charge on charge storage structure 202 of memory cell 211 to reflect the value of information to be stored in memory cell 211.

In the example write operation of FIG. 2C, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Figure 2D:
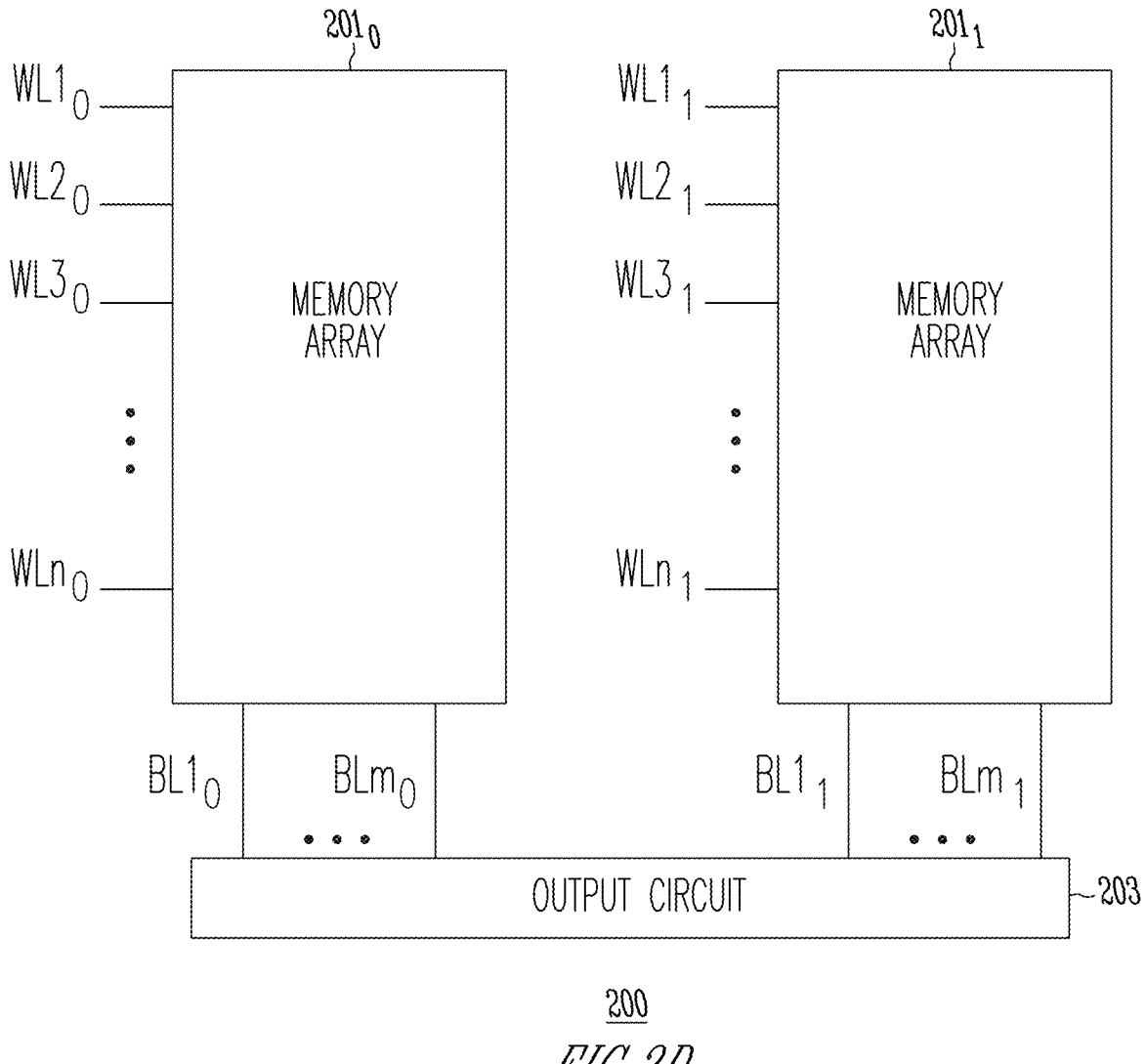
FIG. 2D shows the memory device of FIG. 2A, including two memory arrays, according to some embodiments described herein.

FIG. 2D shows a block diagram of memory device 200 including two memory arrays $201_0$ and $201_1$, according to some embodiments described herein. Each of memory arrays $201_0$ and $201_1$ can include elements similar to or the same as the elements of memory array 201 shown in FIG. 2A. As described above, FIG. 2A shows a schematic diagram of memory array 201, which is one of multiple memory arrays (e.g., memory arrays $201_1$ and $201_1$) of memory device 200.

In FIG. 2D, memory array $201_0$ can include (e.g., can correspond to) memory array 201 of FIG. 2A including memory cells (not shown in FIG. 2D) like memory cells 210 through 217 of FIG. 2A. In FIG. 2D, the access lines (e.g., word lines) associated with signals $WL1_0$ through $WLn_0$ can include (e.g., can correspond to) access lines 241, 242, 243, and 244 of FIG. 2A. In FIG. 2D, the data lines (associated with signals $BL1_0$ through $BLm_0$) associated with memory array $201_0$ can include (e.g., can correspond to) data lines 271 and 272 of FIG. 2A and other data lines (not shown in FIG. 2A) associated with memory array 201 of FIG. 2A.

In FIG. 2D, memory array $201_1$ can also include memory cells (not shown in FIG. 2D) like memory cells 210 through 217 of FIG. 2A. In FIG. 2D, the access lines (e.g., word lines) associated with signals $WL1_1$ through $WLn_1$ can be similar to access lines 241, 242, 243, and 244 associated with memory array 201 of FIG. 2A. In FIG. 2D, the data lines (associated with signals $BL1_1$ through $BLm_1$) associated with memory array $201_1$ can be similar to data lines 271 and 272 of FIG. 2A and other data lines (not shown in FIG. 2A) associated with memory array 201 of FIG. 2A.

In FIG. 2D, memory arrays $201_0$ and $201_1$ can have their own access lines (e.g., word lines) such that the access lines (associated with signals $WL1_0$ through $WLn_0$) associated with memory array $201_0$ can be electrically separated from the access lines (associated with signals $WL1_1$ through $WLn_1$) associated with memory array $201_1$. Thus, voltages provided to signals $WL1_0$ through $WLn_0$ associated with memory array $201_0$ (e.g., during a read or write operation) can be different from voltages provided to signals $WL1_1$ through $WLn_1$ associated with memory array $201_1$.

In an example physical structure of memory device 200, memory arrays $201_0$ and $201_1$ can be located side-by-side with each other (e.g., located laterally on the same plane). In another example physical structure of memory device 200, memory arrays $201_0$ and $201_1$ can be stacked one over another (e.g., located vertically over a substrate). For example, memory array $201_0$ can be formed over a semi-conductor substrate and memory array $201_1$ can be formed (e.g., formed vertically) over memory array $201_0$.

As shown in FIG. 2D, memory device 200 can include an output circuit 203 coupled to memory arrays $201_0$ and $201_1$. Output circuit 203 can include elements that can operate to determine information read from (e.g., in a read operation) the memory cells or stored in (e.g., in a write operation) the memory cells of memory arrays $201_0$ and $201_1$.

The memory devices described herein (e.g., memory device 100 and 200) can be configured to implement a neural network described below.

Figure 3:
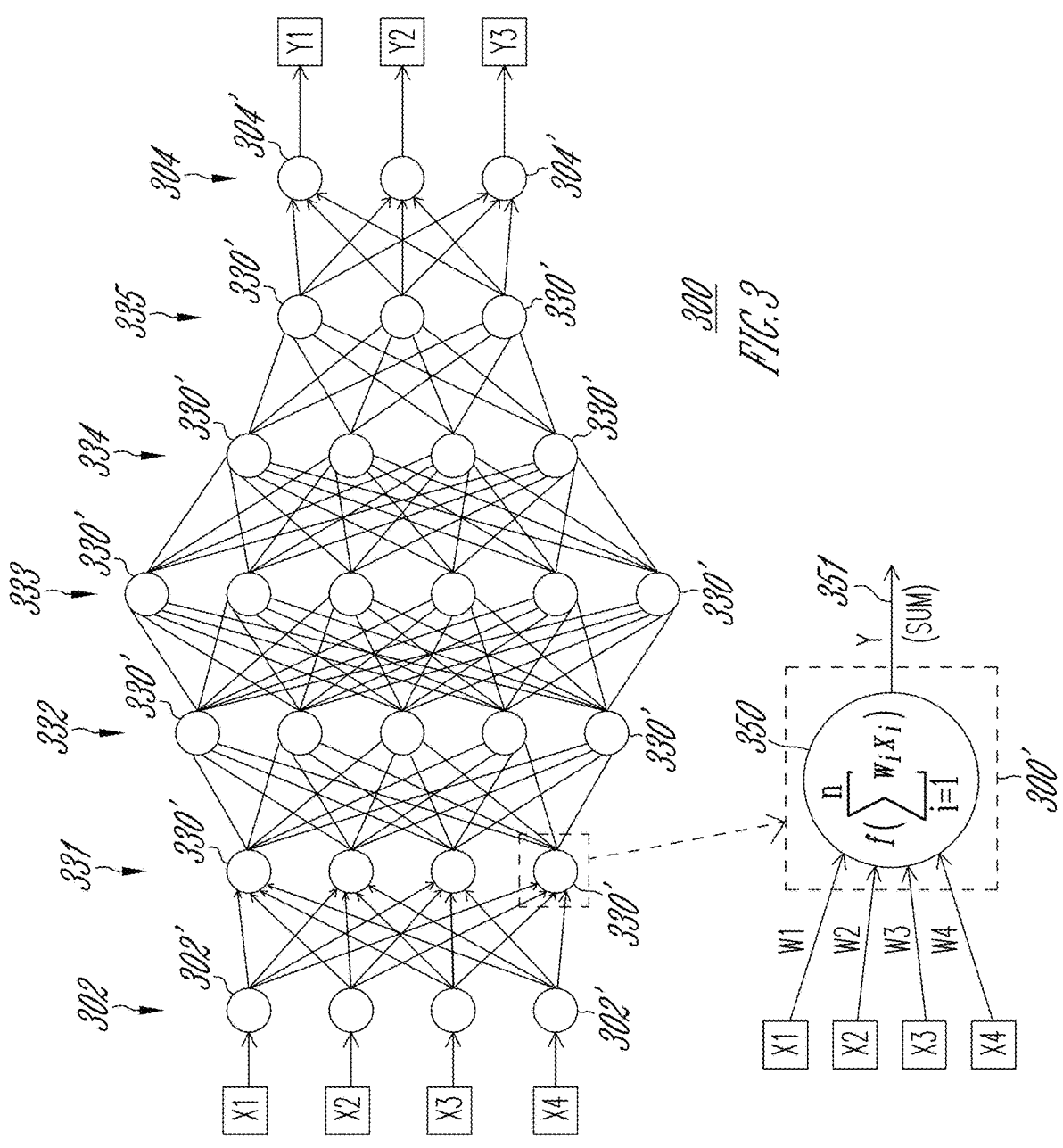
FIG. 3 shows an example of a neural network according to some embodiments described herein.

FIG. 3 shows an example of a neural network 300 according to some embodiments described herein. Neural network 300 can be implemented at least from the memory devices described herein (e.g., memory devices 100 or 200), as described in more detail below. Neural network 300 can be a model of a real network. For example, neural network 300 may be structured to mimic networks of neurons (e.g., neurons in a human brain) by using building blocks (e.g., neuron models) to attempt to emulate the neurons of a neural network. FIG. 3 also shows a graphical example of a simulated neuron (e.g., neuron model 300' described below) that may be used to attempt to mimic a neuron of a neuron network (e.g., a human brain). Neuron models such as neuron model 300' are sometimes referred to as perceptrons.

As shown in FIG. 3, neural network 300 can include an input stage 302, an output stage 304, and stages (e.g., intermediate stages) 331, 332, 333, 334, and 335 between input stage 302 and output stage 304. Stages 331 through 335 can be called layers (e.g., hidden layers) in neural network such as neural network 300. FIG. 3 shows neural network 300 having five intermediate stages (e.g., five hidden stages 331 through 335) as an example. Neural network 300 can include a different number of intermediate stages.

As shown in FIG. 3, input stage 302 can include nodes 302'. Each of nodes 302' can include (e.g., can be implemented by) circuitry (e.g., a collection of circuit elements including transistors) to receive respective input information $X_i$. Index i can have a range from 1 to n, where n is the number of input information provided to respective nodes 302'. FIG. 3 shows an example of four input information (e.g., n=4) X1, X2, X3, and X4. Thus, index i is from 1 to 4 in the example of FIG. 3.

In neural network 300, information can propagate from input stage 302 output stage 304 (e.g., from left to right of FIG. 3). Thus, stage 331 can be called a first intermediate stage (e.g., a hidden layer closest to input stage 302) and stage 335 can be called a last intermediate stage (e.g., a hidden stage closest to output stage 304). In the example, of FIG. 3, nodes 302' can include circuitry (e.g., drivers or buffers) to pass input information X1, X2, X3, and X4 from respective nodes 302' to another stage (e.g., stage 331) of neural network 300.

As shown in FIG. 3, each of stages 331 through 335 can include nodes 330'. Each node 330' can include (e.g., can be implemented by) circuitry having input terminals to receive input information and an output terminal (or output terminals) to provide an output information based at least in part on the input information. The output information from node 330' of a preceding stage (e.g., stages 331 through 335) can be provided as input information to nodes 330' of a succeeding stage (e.g., stages 331 through 335 and output stage 304) of neural network 300.

Output stage 304 can include nodes 304'. Each node 304' can include (e.g., can be implemented by) circuitry having input terminals to receive input information and an output terminal (or output terminals) to provide an output information based at least in part on the input information. Each node 304' can receive respective input information, which are output information from nodes 330' of stage 335, and provide a respective output information (e.g., output information Y1, Y2, or Y3). Output information Y1, Y2, and Y3 can also be called results Y1, Y2, and Y3. FIG. 3 shows three output information Y1, Y2, and Y3 as an example. However, neural network 300 can include fewer or more than three output information based on the structure of neural network 300.

FIG. 3 shows neural network 300 having specific number of nodes 302', 304', and 330' in respective stages 302, 304, and stage 331 through 335 as an example. Neural network 300 can include a different number of nodes from those shown in FIG. 3.

As mentioned above, FIG. 3 also shows a neuron model 300' of neuron network 300. Neuron model 300' can be a model of nodes 330' and 304'. Neuron model 300' can include terminals (e.g., input terminals) to receive input information 1 through n, such as input information X1, X2, X3, and X4 in the example of FIG. 3. Input information 1 through n provided to neuron model 300' can be associated with (e.g., can be multiplied by) a corresponding number of 1 through n weight information, respectively, in neuron model 300'. As shown in FIG. 3, input information X1, X2, X3, and X4 (e.g., n=4) can be associated with (e.g., can be weighted by) weight information W1, W2, W3, and W4 (e.g., n=4), respectively. Weight information W1, W2, W3, and W4 can be called synaptic weights. Each weighted input (e.g., the product of one input information (e.g., X1) and an associated weight information (e.g., W1) can be called a synapse. Each of weight information W1 through W4 can correspond to a memory in human brain behavior.

Input information (e.g., X1, X2, X3, and X4) can be provided to neural network 300 by an external source. The input information can include signals. For example, each of input information X1, X2, X3, and X4 and be in the form of electric signal (e.g., voltage signal or current signal). The values of the input information provided to neural network 300 can be generated responsive to sensing some form of stimuli (e.g., a voltage, a current, or some input information having a particular data value (e.g., binary digits)).

Weight information (e.g., W1, W2, W3, and W4) associated with the input information (e.g., X1, X2, X3, and X4) for neural network 300 can be stored in memory cells of a memory device (e.g., memory device 100 or 200 described herein) before the input information are provided to neuron network 300. A write operation (e.g., write operation associated with FIG. 2C) of memory device 200 can be performed to store weight information in memory cells of memory device 200. The values (e.g., states) of respective weight information (e.g., W1, W2, W3, and W4) can be based on characteristic (e.g., based on simulation) of neural network 300. For example, the values of weight information stored (or to be stored) in the memory cells of memory device 200 can be determined (e.g., selected) by providing stimuli (e.g., in a laboratory environment) to neural network 300 to determine a particular pattern (e.g., programming pattern) of the memory cells that generates one or more operating characteristics (e.g., desired operating characteristics) of neural network 300. Such operating characteristics can be obtained (e.g., measured) based on information (e.g., in the formed of current signals) provided on the data lines (e.g., data lines 271 and 272) of memory device 200.

As shown in FIG. 3, neuron model 300' can include a summation function 350 that can perform an addition operation on the weighted input information (the product (multiplication) of input information and respective weight information) to produce information Y (e.g., intermediate output information) at an output (e.g., output terminal or output terminals) 351. In FIG. 3, result SUM (sum or summation) at output 351 can represent the value of information Y. Information Y can also be called result Y in this description. Information (e.g., information Y) at output 351 is sometimes called classes. As described in more detail below, result SUM can be obtained (e.g., calculated) based on an accumulation of multiplication of input information and weight information associated with respective memory cells. Thus, result SUM can be called multiply-accumulate information, which is the accumulation of the multiplication (product) of input information and weight information associated with a respective portion of memory cells of memory device 200. Likewise, information Y can also be called multiply-accumulate information.

In the example of FIG. 3 index "i" in summation function 350 starts from 1 to n where n is the number input information and the number of weight information associated with the input information. In the example of FIG. 3 where n=4 (as described above), index i is from 1 to n=4.

In FIG. 3, the value of information Y (which is the value of result SUM) can be calculated based on Equation (1) below.

$$Y = \text{SUM} = X1*W1 + X2*W2 + X3*W3 + X4*W4 \qquad (1)$$

In equation (1) symbol "*" means multiplication operation.

As described below (e.g., with reference to FIG. 4A, FIG. 4B, and FIG. 4C), the multiplication operation (the product of each of X1*W1, X2*W2, X3*W3, and X4*W4) in Equation (1) of an input information (e.g., X1) and an associated weight information (e.g., W1) can be performed by a respect memory cell (e.g., one of memory cell 210 through 217) of memory device 200.

In FIG. 3, information Y from nodes 330' of the same stage (e.g., stage 331) can have the same value or different values depending on the values of input information $X_i$ and the values of associated weight information $W_i$ in a particular node 330'.

Information Y from output 351 of node 330' of a stage (e.g., stage 331) can be provided as input information to at least one node 330' of another stage (e.g., stage 322). As shown in FIG. 3, information Y from node 330' of stage 331 can be provided as input information to each of node 330' (e.g., five nodes 330') of a succeeding stage (e.g., stage 332) of stage 331. Information Y (not labeled) from a node 330' of stage 335 can be provided as input information to each of node 304' (e.g., three nodes 304') of output stage 304.

The operation (e.g., multiply-accumulate operation) to obtain information Y (multiply-accumulate information) can be performed in voltage domain or in time domain. In the voltage domain, information Y can be calculated based on Equation (1), as described above, in which the magnitude of the voltages (e.g., input information, weight information, or both) can be varied.

In the time domain, information Y can be calculated based on Equation (4) below.

$$Y = \text{SUM} = t1(X1*W1) + t2(X2*W2) + t3(X3*W3) + t4(X4*W4) \qquad (4)$$

In Equation (4), the terms t1, t2, t3, and t4 are time durations, in which time durations t1, t2, t3, and t4 can have different values. In Equation (4), the weight information can be the same (e.g., W1=W2=W3=W4). The value of information Y in Equation (4), in the time domain, can be calculated based on current (e.g., integrated current), which can be based on the products (X1*W1), (X2*W2), (X3*W3), and (X4*W4). As shown in Equation (4), the values of products (X1*W1), (X2*W2), (X3*W3), and (X4*W4), in time domain, can be functions of (can be based on) the values of time durations t1, t2, t3, and t4, respectively.

In FIG. 3, output information Y1, Y2, and Y3 from output stage 304 can be provided to additional components for further processing. The additional components can be included in a memory device (e.g., memory device 100 or 200) or external to the memory device.

Memory device 200 can include a memory control unit (e.g., like memory control unit 118 of FIG. 1) that can include circuitry configured to operate on the memory cells (e.g., the memory cells in memory arrays $201_0$ and $201_1$ in FIG. 2D) to obtain multiply-accumulate information. For example, the memory control unit can be configured with hardware, firmware, or software, or any combination of hardware, firmware, and software, to accumulate information (e.g., multiply-accumulate information) based on multiplication of input information provided to the access lines coupled to the memory cells and weight information stored in the memory cells. Part of the memory control unit of memory device 200 that is configured to perform operations associated with neuron network 300 (FIG. 3) as described herein (e.g., to obtain the multiply-accumulate information) may be located inside memory device 200 or alternatively located outside memory device 200 (e.g., located in a memory controller (e.g., a memory controller chip) external to memory device 200).

Neural network 300 of FIG. 3 can be implemented using a memory device like memory device 100 and 200 described herein.

Figure 4A:
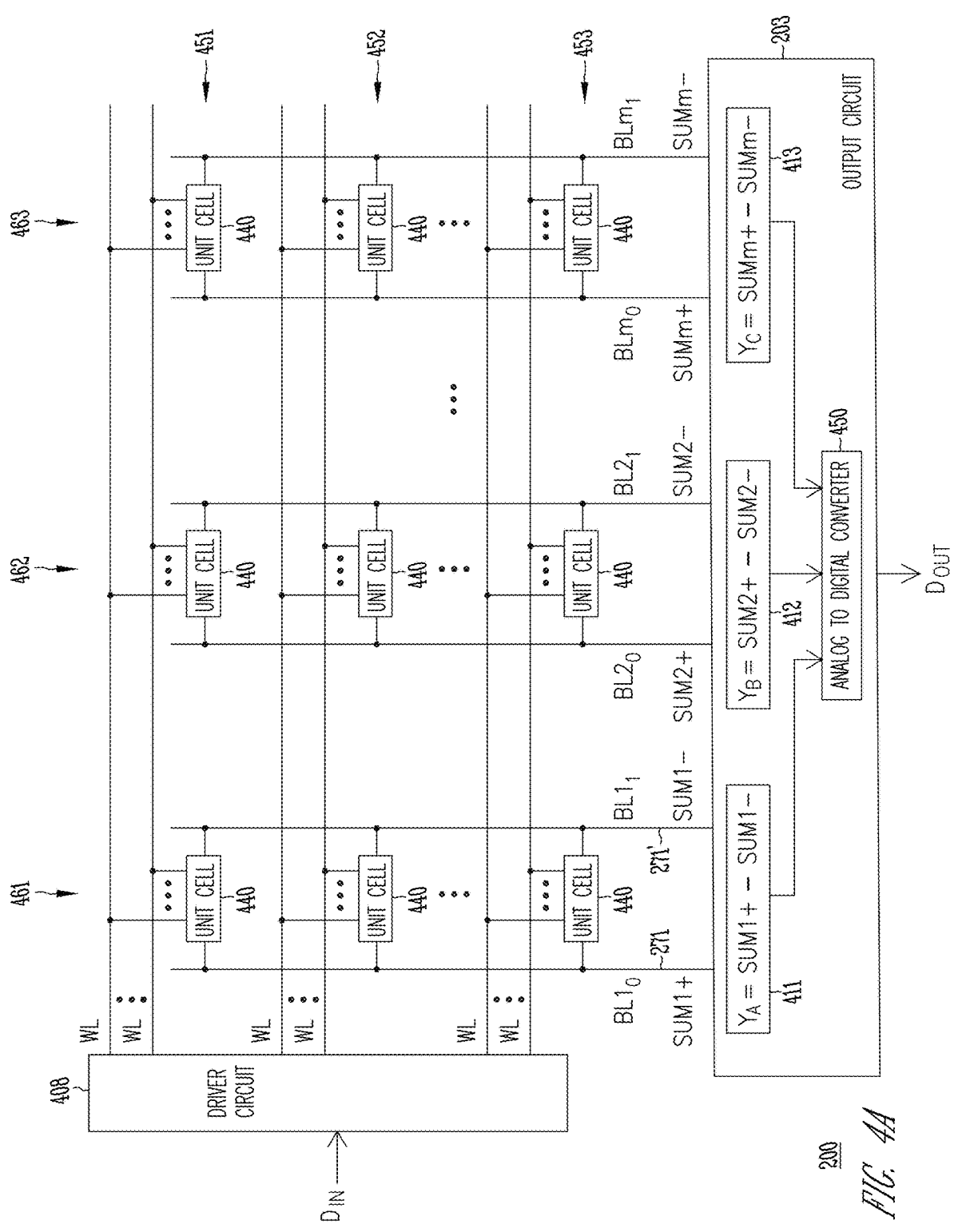
FIG. 4A shows a block diagram of the memory device of FIG. 2A including unit cells, according to some embodiments described herein.
Figure 4B:
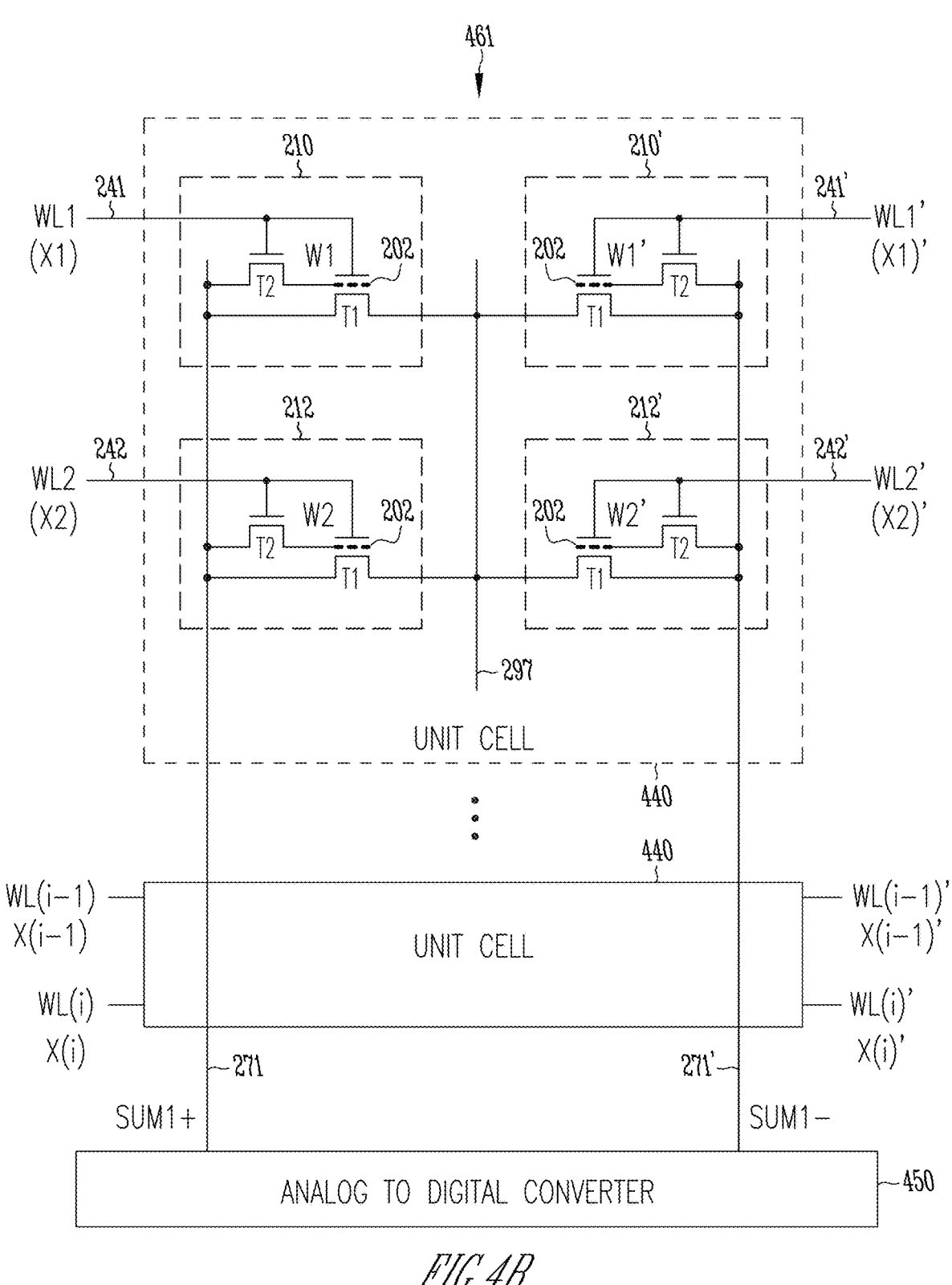
FIG. 4B and FIG. 4C show part of a column of the memory device of FIG. 4A including different variations of a unit cell of the memory device, according to some embodiments described herein.
Figure 4C:
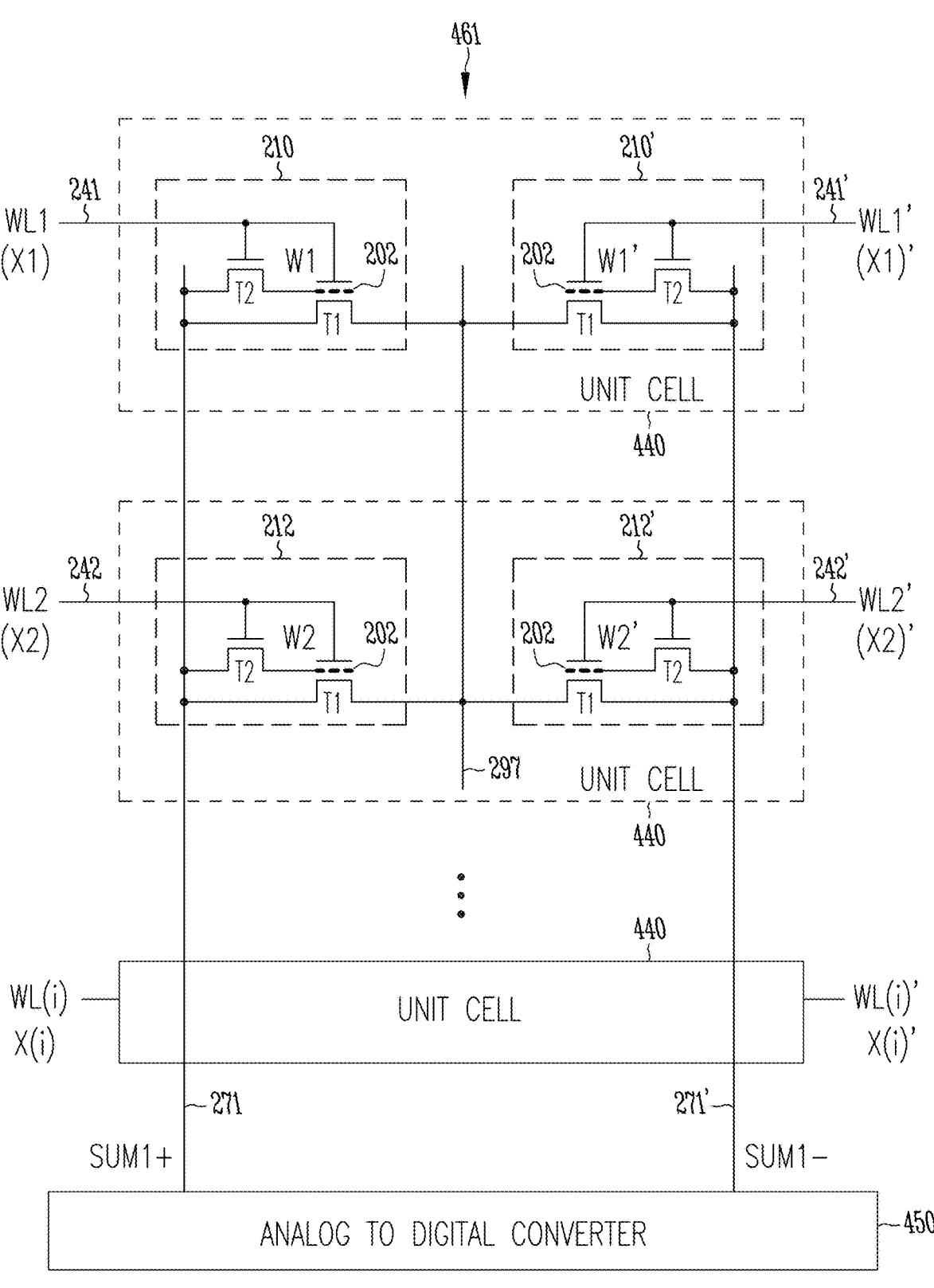

FIG. 4A shows a block diagram of memory device 200 including unit cells 440, according to some embodiments described herein. Each unit cell 440 can include at least one memory cell of memory device 200. For example, part of the memory cells in each unit cell 440 can include multiple memory cells among memory cells 210 through 217 in FIG. 2A. FIG. 4B and FIG. 4C (described below) show different variations of each unit cell 440 and associated access lines and data lines coupled to each unit cell 440 of FIG. 4A.

As shown in FIG. 4A, unit cells 440 can be arranged (e.g., schematically arranged) in rows 451, 452, and 453, and columns 461, 462, and 463. For simplicity, in some of the figures described herein (e.g., FIG. 4A) the same labels (e.g., labels WLs) are occasionally used for both signals (e.g., word line signals) and the conductive lines (e.g., word lines) associated with those signals.

As shown in FIG. 4A, each unit cell 440 can be associated with (e.g., can be controlled by) multiple access lines WLs. Access lines WLs of the same row (e.g., row 451) can be different from (e.g., electrically uncoupled to) each other and different from (e.g., electrically uncoupled to) access lines WLs of another row (e.g., row 452 or 453).

FIG. 4A shows two access lines WLs in each row and dots between the two access lines to indicate that the number of access lines WLs in each row can be at least two (two or more access lines in each row). Access lines WLs of the same row (e.g., row 451) can be associated with memory cells of different memory arrays (e.g., two different arrays).

For example, a portion of access lines WLs in row 451 can be associated with (e.g., coupled to) memory cells from memory array $201_0$ (FIG. 2D) and another portion of access lines WLs in row 451 can be associated with (e.g., coupled to) memory cells from memory array $201_1$ (FIG. 2D).

As shown in FIG. 4A, memory device 200 can include a driver circuit 408 to drive (e.g., provide signals to) access lines WLs. Driver circuit 408 can be part of row access of memory device 200 that can be similar to row access circuitry 108 of memory device 100 of FIG. 1. Driver circuit 408 can receive information (e.g., digital information) $D_{IN}$ and provide input information (e.g., analog information like input information X1, X2, X3, and X4 in FIG. 3) in the form of voltage signals to respective access lines WLs based on information $D_{IN}$.

As shown in FIG. 4A, unit cells 440 in each column (e.g., each of columns 461, 462, and 463) can be associated with (e.g., coupled to) two data lines (also called a data line pair or a pair of data lines). For simplicity, in some of the figures described herein (e.g., FIG. 4A) signals (e.g., bit line signals) and the data lines (e.g., bit lines) associated with those signals are given the same labels. For example, FIG. 4A shows data lines $BL1_0$ and $BL1_1$ (associated with signals $BL1_0$ and $BL1_1$). Data line $BL1_0$ can correspond to data line 271 of FIG. 2A. Thus, in FIG. 4A, data line $BL1_0$ can also be called data line 271. In FIG. 4A, data line $BL1_1$ can also be called data line 271'.

In FIG. 4A, data lines $BL1_0$, $BL2_0$, and $BLm_0$ can be included in the data lines associated with signals $BL1_0$ through $BLm_0$ in memory array $201_0$ in FIG. 2D. Data lines $BL1_1$, $BL2_1$, and $BLm_1$ can be included in the data lines associated with signals $BL1_1$ through $BLm_1$ in memory array $201_1$ in FIG. 2D. Thus, a data line pair (e.g., data lines 271 and 271') in a column can include data lines associated with different memory arrays. For example, in column 461, data lines 271 and 271' (also called data lines $BL1_0$ and $BL1_1$) can be associated with (e.g., coupled to) memory cells from memory arrays $201_0$ and $201_1$, respectively. In column 462, data lines $BL2_0$ and $BL2_1$ can be associated with (e.g., coupled to) memory cells from memory arrays $201_0$ and $201_1$, respectively. In column 463, data lines $BLm_0$ and $BLm_1$ can be associated with (e.g., coupled to) memory cells from memory arrays $201_0$ and $201_1$, respectively.

As shown in FIG. 4A, output circuit 203 (which is also shown in FIG. 2D) of memory device 200 can be coupled to data lines $BL1_0$, $BL2_0$, $BLm_0$, $BL1_1$, $BL2_1$, and $BLm_1$. Output circuit 203 can include elements (e.g., sense amplifiers and page buffers) that can be similar to or the same as those of sensing circuitry 103 and select circuit 115 of memory device 100 of FIG. 1. Output circuit 203 in FIG. 4A can operate to determine the value of information on data lines $BL1_0$, $BL2_0$, $BLm_0$, $BL1_1$, $BL2_1$, and $BLm_1$ during a memory operation (e.g., a read or write operation).

As shown in FIG. 4A, data lines $BL1_0$, $BL2_0$, $BLm_0$, $BL1_1$, $BL2_1$, and $BLm_1$ can provide results SUM1+, SUM1−, SUM2+, SUM2−, SUMm+, and SUMm−, respectively, during a memory operation (e.g., a read operation) of memory device 200. Each of results SUM1+, SUM1−, SUM2+, SUM2−, SUMm+, and SUMm− can be based on current (e.g., the amount of current) on a respective data line during an operation (e.g., a read operation) of memory device 200. As described in more detail below, the values (e.g., analog values) of each of results SUM1+, SUM1−, SUM2+, SUM2−, SUMm+, and SUMm− can be based on input information (e.g., $X_i$) and weight information (e.g., W1) associated a portion of memory cells and in a respective unit cell 440 in a respective column among columns 461, 462, and 463.

As shown in FIG. 4A, output circuit 203 can include an analog-to-digital converter (ADC) 450. ADC 450 can include a k-bit ADC. As an example, ADC 450 can be a 6-bit ADC (where k=6). ADC 450 can operate to convert analog information (e.g., analog voltage value) to into digital information.

As shown in FIG. 4A, output circuit 203 can include circuits 411, 412, and 413 that can operate to perform respective operations (e.g., subtraction operations) on results SUM1+, SUM1−, SUM2+, SUM2−, SUMm+, and SUMm− to provide information (e.g., intermediate output information) $Y_A$, $Y_B$, and $Y_C$. Information $Y_A$, $Y_B$, and $Y_C$ can include analog output information. The values (e.g., analog values) of information $Y_A$, $Y_B$, and $Y_C$ can be calculated by circuits 411, 412, and 413, respectively, based on results SUM1+, SUM1−, SUM2+, SUM2−, $$Y_A = \text{SUM1} + - \text{SUM1} - (\text{which is SUM1} + \text{minus SUM1} -)$$

$$Y_B = \text{SUM2} + - \text{SUM2} - (\text{which is SUM2} + \text{minus SUM2} -)$$

$$Y_C = \text{SUM}m + - \text{SUM}m - (\text{which is SUM}m + \text{minus SUM}m -)$$

In FIG. 4A, ADC 450 can operate to convert information $Y_A$, $Y_B$, and $Y_C$ into digital information. Output circuit 203 can provide (e.g., generate) information $D_{OUT}$, which is digital information that includes a number of bits. Information $D_{OUT}$ includes digital values (e.g., bits) of information $Y_A$, $Y_B$, and $Y_C$.

Each of result SUM1+, SUM1−, SUM2+, SUM2−, SUMm+, and SUMm− can be similar to result SUM of FIG. 3. Thus, each of result SUM1+, SUM1−, SUM2+, SUM2−, SUMm+, and SUMm− can be called multiply-accumulate information, which is the accumulation of the multiplication (product) of input information and weight information associated with respective portion of memory cells of memory device 200. Likewise, each of information $Y_A$, $Y_B$, and $Y_C$ can also be called multiply-accumulate information associated with respective portion of memory cells of memory device 200.

Memory device 200 can provide information $D_{OUT}$ to a memory control unit (e.g., like memory control unit 118 of FIG. 1) of memory device 200 for further processing. For example, the digital values of information $Y_A$, $Y_B$, and $Y_C$ can be used to generate input information that can be provided to nodes 330' of a stage (e.g., a succeeding stage) among stages 331 through 335 of neural network 300 (FIG. 3) as part of calculating the values for output information Y1, Y2, and Y3 at output stage 304.

In FIG. 4A, each of result SUM1+, SUM1−, SUM2+, SUM2−, SUMm+, and SUMm− can be part of result SUM at output 351 of neural model 300' in FIG. 3. FIG. 4B and FIG. 4C show different structures (e.g., different variations) of memory device 200 shown FIG. 2A and FIG. 2D) that can be configured to implement neural network 300 of FIG. 3 including elements (e.g., memory cells and associated circuitry) to calculate the value of result SUM1+, SUM1−, SUM2+, SUM2−, SUMm+, and SUMm− of FIG. 4A.

FIG. 4B shows part of column 461 of memory device in FIG. 4A including details of unit cell 440. Other columns 462 and 463 (FIG. 4A) of memory device 200 are not shown in FIG. 4B. However, the structures (including unit cells

440) in columns 462 and 463 of memory device 200 have similar elements (e.g., memory cells) like unit cell 440 in column 461 in FIG. 4B.

The description of unit cell 440 in FIG. 4B refers to unit cell 440 in dashed line (top unit cell 440). Other unit cells 440 in column 461 of memory device 200 have similar elements.

The description of FIG. 4B includes descriptions for obtaining (e.g., calculating) results SUM1+ and SUM1−. Other results including SUM2+, SUM2−, SUMm+, and SUMm− of FIG. 4A can be obtained in similar ways as results SUM1+ and SUM1−. For example, each of results SUM2+ and SUMm+ in FIG. 4A can be obtained (e.g., calculated) in ways similar to result SUM1+ described below. In another example, each of results SUM2− and SUMm− in FIG. 4A can be obtained (e.g., calculated) in ways similar to result SUM1− described below. For simplicity, the description herein omits detailed description for obtaining results like results SUM2+, SUM2−, SUMm+, and SUMm− of FIG. 4A.

As shown in FIG. 4B, unit cell 440 can include memory cells (four memory cells) 210, 212, 210', and 212'. Each of memory cells 210, 212, 210', and 212' can store one bit of information (e.g., weight information). Thus, in the example of FIG. 4B, each unit cell 440 can be configured to store four bits per unit cell 440. Therefore, each unit cell 440 can be configured to store information (e.g., four bits) associated with (e.g., to reflect) the values of four different weight information in each unit cell 440.

For example, as shown in FIG. 4B, memory cells 210, 212, 210', and 212' of unit cell 440 can be configured to store weight information (e.g., four weight information) W1, W2, W1', and W2'. The combination of weight information W1, W2, W1', and W2' can be binary coded weight information. The values of weight information W1, W2, W1', and W2' can be based on weight information from neural network 300 (FIG. 3).

As shown in FIG. 4B, each unit cell 440 in column 461 can be associated with data lines 271 and 271' and a combination of access lines (e.g., the combination of access lines 241, 242, 241' and 242' or the combination of access lines WL(i), WL(i−1), WL(i)', and WL(i−1)'). Access lines 241, 242, 241', and 242' can be part of the access lines WLs in one row (e.g., row 451) of FIG. 4A. Access lines WL(i), WL(i−1), WL(i)', and WL(i−1)' can be part of the access lines WLs in another row (e.g., row 453) of FIG. 4A.

In FIG. 4B, memory cells 210 and 212, access lines 241 and 242, and data line 271 are the same as those shown in FIG. 2A and can be included in one of memory array (e.g., memory array 201₀ in FIG. 2D) of memory device 200.

Memory cells 210' and 212', access lines 241' and 242', and data line 271' in FIG. 4B can be similar to memory cells 210 and 212, access lines 241 and 242, and data line 271, respectively, of FIG. 2A. However, memory cells 210' and 212', access lines 241' and 242', and data line 271' can be included in another memory array (e.g., memory array 201₁ in FIG. 2D) of memory device 200 different from a memory array (e.g., memory array 201₀ in FIG. 2D) associated with memory cells 210 and 212, access lines 241 and 242, and data line 271.

In FIG. 4B, input information X1 and X2 can represent the values of voltages applied to signals WL1 and WL2, respectively. Input information X1' and X2' can represent the values of voltages applied to signals WL1' and WL2', respectively.

Access lines WL(i), WL(i−1), WL(i)', and WL(i−1)' can be coupled to four memory cells (not shown) in unit cell 440 in ways similar to access lines 241, 242, 241', and 242', respectively, coupled to memory cells 210, 212, 210', and 212', respectively. Access lines 241, 242, WL(i), and WL(i−1) can be electrically separated from each other and from each of access lines 241', 242', WL(i)', and WL(i−1)'. Access lines associated with signals WL1, WL2, WL(i), and WL(i−1) can be associated with memory cells in a memory array (e.g., memory array 201₀ in FIG. 2D) of memory device 200. Access lines associated with signals WL1', WL2, WL(i), and WL(i−1) can be associated with memory cells in another memory array (e.g., memory array 201₁ in FIG. 2D) of memory device 200.

In FIG. 4B, input information X(i−1) and X(i) can represent the values of voltages applied to access lines WL(i) and WL(i−1), respectively. Input information X(i−1)' and X(i)' can represent the values of voltages applied to access lines WL(i)' and WL(i−1)', respectively.

As shown in FIG. 4B, each of memory cells 210, 212, 210', and 212' can include transistors T1 and T2 and charge storge structure 202. Memory cells 210, 212, 210', and 212' can be coupled to connection (e.g., common plate) 297 through a respective transistor T1. As described above, connection 297 can be coupled to a ground connection or can be part of the ground connection of memory device 200. Description and operation of each memory cell (e.g., memory cell 210 and 212) of unit cell 440 in FIG. 4B is described above with reference to FIG. 2A through FIG. 2C.

In operation, data lines 271 and 271' can provide results SUM1+ and SUM1−, respectively. The value of outputs SUM1+ and SUM1− can be used to calculate information Y_A (shown FIG. 4A) based on the following Equations (2) and (3) below.

$$\text{SUM1} += \qquad \text{Equation (2)}$$
$$X1*W1+X2*W2+\ldots+X(i-1)*W(i-1)+X(i)*W(i).$$

$$\text{SUM1} -= X1'*W1'+X2'*W2'+ \qquad \text{Equation (3)}$$
$$\ldots+X(i-1)'*W(i-1)'+X(i)'*W(i)'.$$

In Equations (2) and (3), symbol "*" represents multiplication, weight information W(i−1), W(i), W(i−1)' and W(i)' represent the weight information stored in four respective memory cells (not shown) in unit cell 440 (FIG. 4B) associated with access lines WL(i−1), WL(i), WL(i)', and WL(i−1)'.

In Equation (2), multiplication X1*W1 can be performed by memory cell 210. Multiplication X2*W2 can be performed by memory cell 212. Multiplication X(i−1)*W(i−1) and Multiplication X(i)*W(i) can be performed by respective memory cells (similar to memory cells 210 and 212) in unit cell 440 associated with access lines WL(i−1), WL(i), WL(i)', and WL(i−1)'. The value of result SUM1+ can be based on the amount of current on data line 271. Each of multiplications X1*W1+X2*W2+ . . . +X(i−1)*W(i−1)+X(i)*W(i) from Equation (2) can affect (e.g., increase or decrease) the value of current (represented by result SUM1+) on data line 271 depending on the values of input information and corresponding weight information associated with unit cells 440 coupled to data line 271. Thus, the amount of current on data line 271 can be based on the accumulation of currents resulted from respective multiplications X1*W1, X2*W2, X(i−1)*W(i−1), and X(i)*W(i) and currents resulted from other multiplications performed by respective portions of memory cells (like memory cells 210 and 212) of other unit cells 440 (not shown) associated with (e.g., coupled to) data line 271.

Similarly, in FIG. 4B and Equation (3), multiplication X1'*W1' can be performed by memory cell 210'. Multiplication X2'*W2' can be performed by memory cell 212'. Multiplication X(i−1)'*W(i−1)' and Multiplication X(i)'*W(i)' can be performed by respective memory cells (similar to memory cells 210' and 212') in unit cell 440 associated with access lines WL(i−1), WL(i), WL(i)', and WL(i−1)'. The value of result SUM1− can be based on the amount of current on data line 271'. Each of multiplications X1'*W1'+X2'*W2'+ . . . +X(i−1)'*W(i−1)'+X(i)'*W(i)' from Equation (3) can affect (e.g., increase or decrease) the value of current (represented by result SUM1−) on data line 271 depending on the values of input information and corresponding weight information associated with unit cells 440 coupled to data line 271'. Thus, the amount of current on data line 271' can be based on the accumulation of currents resulted from respective of multiplications X1'*W1', X2'*W2', X(i−1)'*W(i−1)', and X(i)'*W(i)' and currents resulted from other multiplications performed by respective portions of memory cells (like memory cells 210' and 212') of other unit cells 440 (not shown) associated with (e.g., coupled to) data line 271'.

Results SUM1+ and SUM1− on respective data lines 271 and 271' can be used to calculate information Y_A (shown in FIG. 4A). As described above, Y_A=SUM1+−SUM1−(which is SUM1+minus SUM1−).

ADC 450 in FIG. 4B is the same as ADC 450 of FIG. 4A. ADC 450 can convert the value of information Y_A (which is SUM1+minus SUM1−) into digital information (which can include a single bit or multiple bits) and provide the digital information to the memory control unit of memory device 200 for further processing as described above.

FIG. 4C shows part of column 461 of memory device in FIG. 4A including details of unit cell 440. Unit cell 440 in FIG. 4C can be a variation of unit cell 440 of FIG. 4B. As described above with reference to FIG. 4B, each unit cell 440 in FIG. 4B can include four memory cells 210, 212, 210', and 212' that can be configured to store four different weight information in each unit cell 440. As shown in FIG. 4C, each unit cell 440 can include two memory cells (e.g., memory cells 210 and 210, or memory cells 212 and 212'). Thus, in the example of FIG. 4C, each unit cell 440 can be configured to store two bits per unit cell 440. Therefore, each unit cell 440 in FIG. 4C can be configured to store information (e.g., two bits) associated with (e.g., to reflect) the values of two different weight information in each unit cell 440.

In FIG. 4C, each unit cell 440 in column 461 can be associated with data lines 271 and 271' and a combination of two access lines (e.g., the combination of access lines 241 and 241', access lines 242 and 242', or access lines WL(i) and WL(i)'). Access lines 241 and 241' can be part of the access lines WLs in one row (e.g., row 451) of FIG. 4A. Access lines 242 and 242' can be part of the access lines WLs in another row (e.g., row 452) of FIG. 4A. Access lines WL(i) and WL(i)' can be part of the access lines WLs in another row (e.g., row 453) of FIG. 4A.

In FIG. 4C, memory cells 210 and 212, access lines 241 and 242, and data line 271 are the same as those shown in FIG. 2A and can be included in one of memory array (e.g., memory array 201₀ in FIG. 2D) of memory device 200.

Memory cells 210' and 212', access lines 241' and 242', and data line 271' in FIG. 4C can be similar to memory cells 210 and 212, access lines 241 and 242, and data line 271, respectively, of FIG. 2A, and can be included in another of memory array (e.g., memory array 201₁ in FIG. 2D) of memory device 200.

In FIG. 4C, input information X1 and X2 can represent the values of voltages applied to signals WL1 and WL2, respectively. Input information X1' and X2' can represent the values of voltages applied to signals WL1' and WL2', respectively.

Access lines WL(i) and WL(i)' can be coupled to two memory cells (not shown) in unit cell 440 in ways similar to access lines 241 and 241', respectively, coupled to memory cells 210 and 210', respectively. Access lines WL1, WL2, and WL(i) can be electrically separated from each other and from each of access lines WL1', WL2', and WL(i)'.

In FIG. 4C, input information X(i) and X(i)' can represent the values of voltages applied to access lines WL(i) and WL(i)', respectively.

Results SUM1+ and –SUM1– can be calculated based on Equations (2) and (3), respectively, in a similar way as described above with reference to FIG. 4B. Results SUM1+ and SUM1– can be used to calculate information $Y_A$ (shown in FIG. 4A). As described above, $Y_A$=SUM1+–SUM1– (which is SUM1+minus SUM1–).

ADC 450 in FIG. 4C is the same as ADC 450 of FIG. 4A. ADC 450 can convert the value of information $Y_A$ (which is SUM1+minus SUM1–) into digital information (which can include a single bit or multiple bits) and provide the digital information to the memory control unit of memory device 200 for further processing as described above.

Figure 5B:
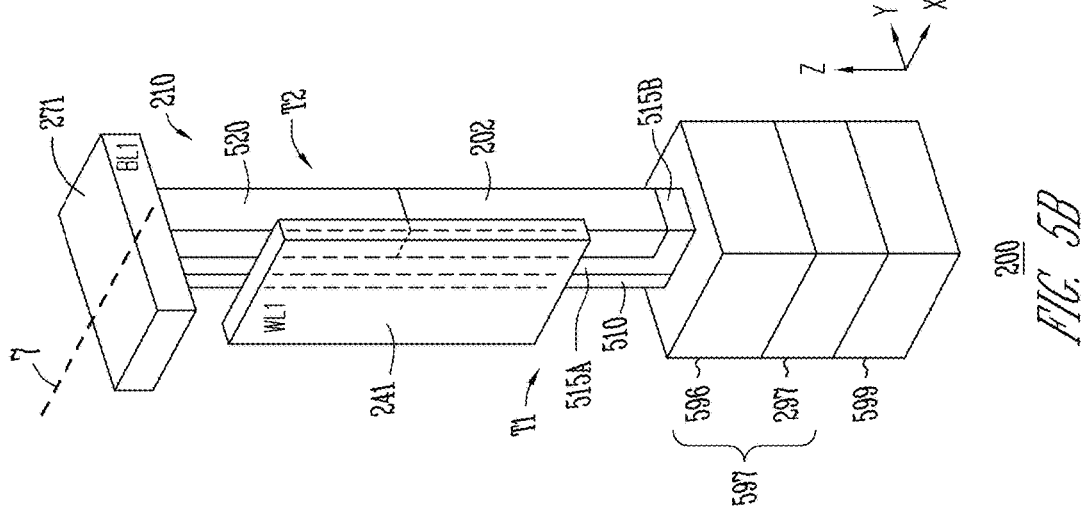
FIG. 5A through FIG. 8 show different views of a structure of the memory device of FIG. 2A, according to some embodiments described herein.
Figure 5A:
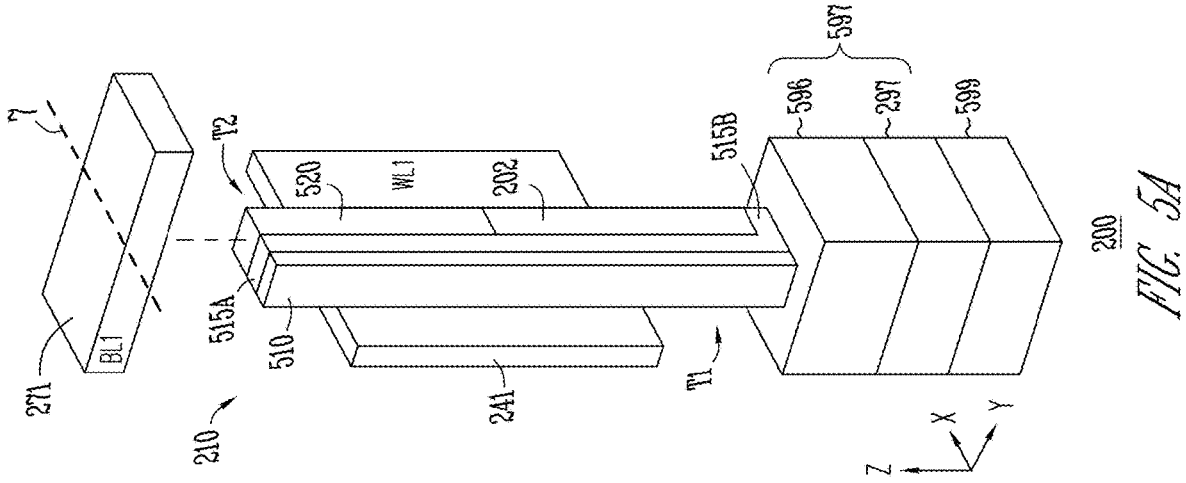
Figure 6A:
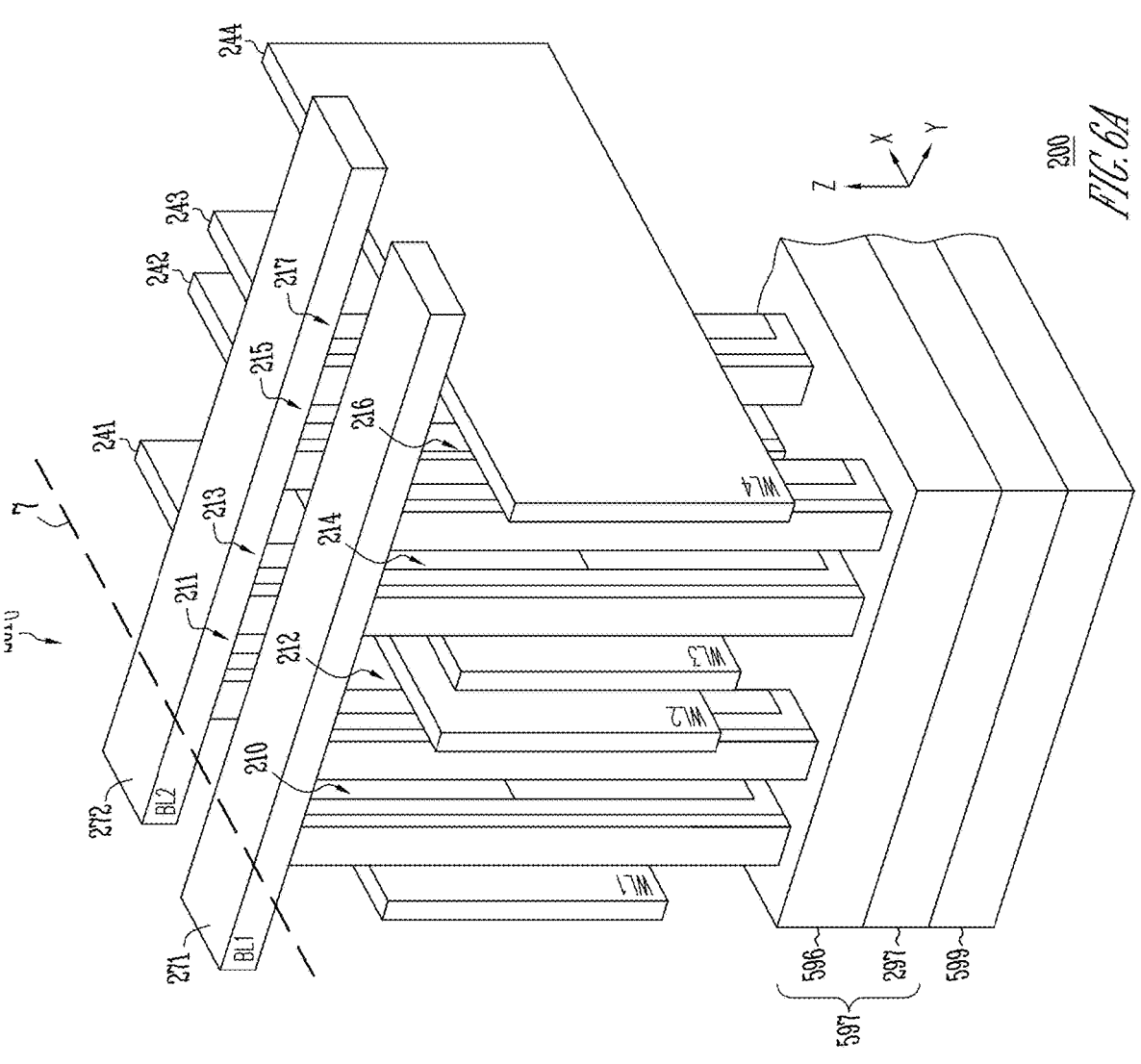

FIG. 5A, FIG. 5B, and FIG. 6A show different 3-dimensional views (e.g., isometric views) of memory device 200 of FIG. 2 with respect to the X, Y, and Z directions. For simplicity, cross-sectional lines (e.g., hatch lines) are omitted from most of the elements shown in FIG. 5A through FIG. 8 and other figures in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 6B:
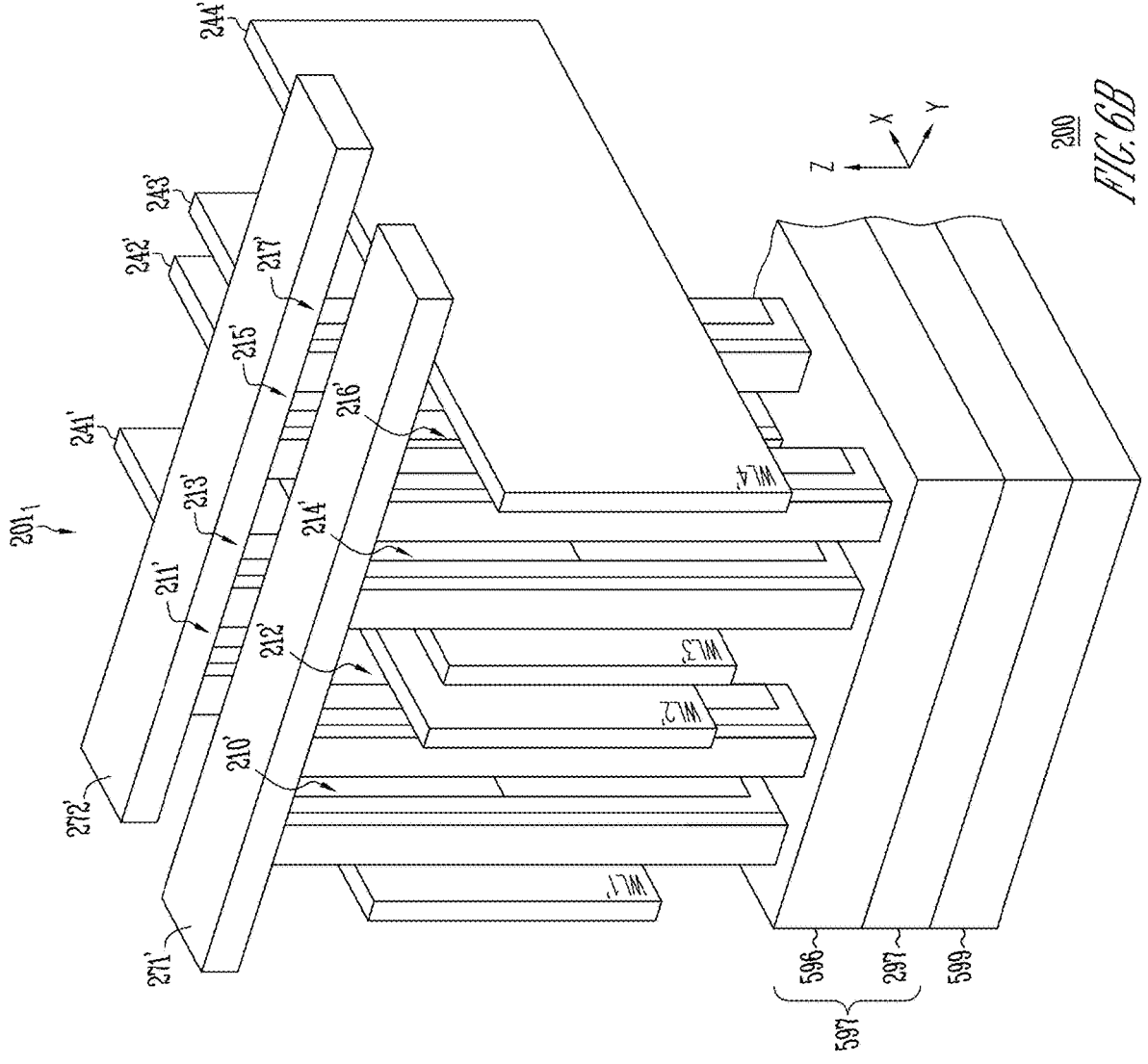

FIG. 5A and FIG. 5B show different 3-dimensional views (e.g., isometric views) of memory device 200 including memory cell 210 with respect to the X, Y, and Z directions. FIG. 6A shows a 3-dimensional view of memory array $201_0$ of memory device 200 of FIG. 2A and FIG. 2D including memory cells 210 through 217 and data lines 271 and 272 with respect to the X, Y, and Z directions. FIG. 6B shows a 3-dimensional view of memory array $201_1$ of memory device 200 of FIG. 2A and FIG. 2D including memory cells 210' through 217' and data lines 271' and 272' with respect to the X, Y, and Z directions. The structure of memory array $201_1$ of FIG. 6B is similar to or the same as the structure of memory array $201_0$ described herein with respect to FIG. 2A through FIG. 6A, FIG. 7, and FIG. 8. Similar or the same elements between memory arrays $201_0$ and $201_1$ are given the same numerical labels. Thus, for simplicity, the description herein omits detailed description of FIG. 6B.

Figure 7:
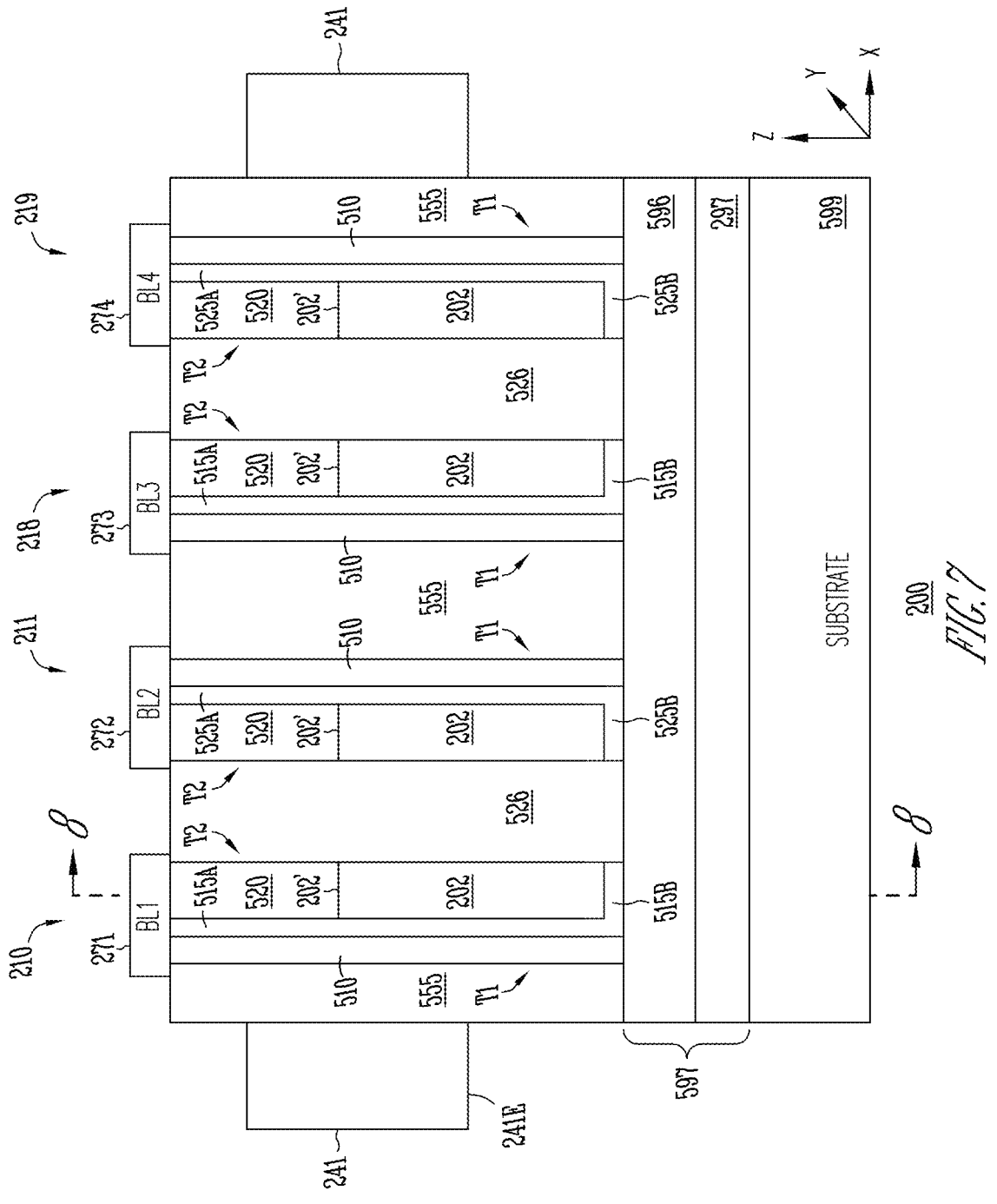
Figure 8:
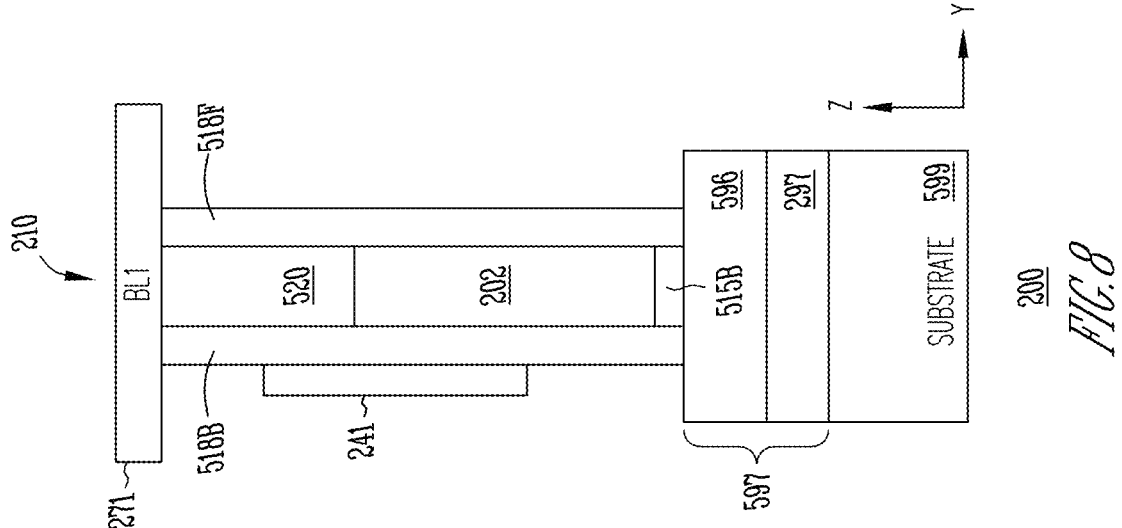

FIG. 7 shows a side view (e.g., cross-sectional view) of memory device 200 including memory cells 210, 211, 218, and 219 with respect to the X-Z direction taken along line 7 of FIG. 6A. Part of memory cell 210 in FIG. 7 can also correspond to a side view (e.g., cross-sectional view) along line 7 of FIG. 5A and FIG. 5B. Memory cells 218 and 219 and associated data lines 273 and 274 in FIG. 7 are not shown in FIG. 2A. However, as shown in FIG. 7, memory cells 218 and 219 can share access line 241 (shown in partial view) with memory cells 210 and 211. Memory cells 218 and 219 in FIG. 7 are not shown in FIG. 2A and FIG. 6A. FIG. 8 shows a view (e.g., cross-sectional view) taken along line 8-8 of FIG. 7.

The following description refers to FIG. 5A through FIG. 8. FIG. 5A and FIG. 5B show the structure of one memory cell (e.g., memory cell 210) of memory device 200. The structures of other memory cells (e.g., memory cells 211 through 217 in FIG. 2A) of memory device 200 can be similar to or the same as the structure of memory cell 210 in FIG. 5A and FIG. 5B. In FIG. 2A through FIG. 8, the same elements are given the same reference numbers. Some portions (e.g., gate oxide and cell isolation structures) of memory device 200 are omitted from FIG. 5A through FIG. 8 so as to not obscure the elements of memory device 200 in the embodiments described herein.

As shown in FIG. 5A and FIG. 5B, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5A, FIG. 5B, and FIG. 6A, memory device 200 can include a conductive region 597 (e.g., a common conductive plate) under the memory cells (e.g., memory cells 210 through 217 in FIG. 6A) of memory device 200. Conductive region 597 can include at least one of the materials (e.g., doped polysilicon) of semiconductor material 596 and the material of connection 297. For example, conductive region 597 can include the material of semiconductor material 596, the material of connection 297, or the combination of the materials of semiconductor material 596 and connection 297. As shown FIG. 7, the memory cells (e.g., memory cells 210, 211, 218 and 219) of memory device 200 can share conductive region 597 (which can include any combination of semiconductor material 596 and connection 297).

Semiconductor material 596 can include a structure (e.g., a piece (e.g., a layer)) of silicon, polysilicon, or other semiconductor material, and can include a doped region (e.g., p-type doped region), or other conductive materials.

As shown in FIG. 5A and FIG. 5B, connection 297 can include a structure (e.g., a piece (e.g., a layer)) of conductive material (e.g., conductive region) located over (formed over) substrate 599. Example materials for connection 297 include a piece of metal, conductively doped polysilicon, or other conductive materials. Connection 297 can be coupled to a ground terminal (not shown) of memory device 200. FIG. 5A and FIG. 5B show connection 297 contacting (e.g., directly coupled to) substrate 599 as an example. In an alternative structure, memory device 200 can include a dielectric (e.g., a layer of dielectric material, not shown) between connection 297 and substrate 599.

As shown in FIG. 5A, FIG. 5B, FIG. 6A, and FIG. 8, access line 241 can be structured as a conductive line (e.g., conductive region) having a length extending continuously in the X-direction, a width in the Z-direction, and a thickness in the Y-direction. Access line 241 can include a structure (e.g., a piece (e.g., a layer)) of conductive material (e.g., metal, conductively doped polysilicon, or other conductive materials). The structure of access line 241 can form part of a gate of transistor T1 and transistor T2 of respective memory cells (e.g., memory cells 210, 212, 218, and 219 in FIG. 7) adjacent access line 241.

Charge storage structure 202 (FIG. 5A through FIG. 8) of each memory cell of memory device 200 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and access line 241 of memory device 200 can be the same or can be different. As shown in FIG. 5A and FIG. 5B, charge storage structure 202 can include a portion (e.g., bottom portion) that is closer (e.g., extends in the Z-direction closer) to substrate 599 than the bottom portion of access line 241.

As shown in FIG. 7, each charge storage structure 202 can include an edge (e.g., top edge) 202'. Access line 241 can include an edge (e.g., bottom edge) 241E. FIG. 7 shows an example where edge 202' is at a specific distance (e.g., distance shown in FIG. 7) from edge 241E. However, the distance between edge 202' of charge storage structure 202 and edge 241E of access line 241 may vary. For example, FIG. 7 shows edge 241E being below edge 202' with respect to the Z-direction, such that access line 241 can overlap (in the Z-direction) charge storage structure 202. However, edge 241E can alternatively be above edge 202' with respect to the Z-direction, such that access line 241 may not overlap (in the Z-direction) charge storage structure 202.

As shown in FIG. 5A, FIG. 5B, FIG. 7, and FIG. 8, memory device 200 can include material 520 located between data line 271 and charge storage structure 202. Material 520 can be electrically coupled to (e.g., directly coupled to (contact)) data line 271. Material 520 can also be electrically coupled to (e.g., directly coupled to (contact)) charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., is directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5A, FIG. 5B, and FIG. 7, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

Material 520 can include a structure (e.g., a piece (e.g., a layer)) of semiconductor material. In the example where transistor T2 is an NFET (as described above), material 520 can include n-type semiconductor material (e.g., n-type silicon).

In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5A, FIG. 5B, and FIG. 7, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5A, FIG. 5B, and FIG. 7, memory cell 210 can include a material 510, which can include a structure (e.g., a piece (e.g., a layer)) of semiconductor material. Example materials for material 510 can include silicon, polysilicon (e.g., undoped or doped polysilicon), germanium, silicon-germanium, or other semiconductor materials and semiconducting oxide materials (oxide semiconductors, e.g., SnO or other oxide semiconductors).

As described above with reference to FIG. 2A, transistor T1 of memory cell 210 includes a channel region (e.g., read channel region). In FIG. 5A, FIG. 5B, and FIG. 7, the channel region of transistor T1 of memory cell 210 can include (e.g., can be formed from) material 510. Material 510 can be electrically coupled to (e.g., directly coupled to (contact) data line 271. As described above with reference to FIG. 2A, memory cell 210 can include a read path. In FIG. 5A, FIG. 5B, and FIG. 7, material 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, material 510 can conduct a current (e.g., read current (e.g., holes)) between data line 271 and connection 297 (through part of semiconductor material 596). The direction of the read current can be from data line 271 to connection 297 (through material 510 and part of semiconductor material 596). In the example where transistor T1 is a PFET and transistor T2 is an NFET, the material that forms material 510 can have a different conductivity type from material 520. For example, material 510 can include p-type semiconductor material (e.g., p-type silicon) regions, and material 520 can include n-type semiconductor material (e.g., n-type gallium phosphide (GaP)) regions.

As shown in FIG. 5A, FIG. 5B, and FIG. 7, memory cell 210 can include dielectric materials 515A and 515B. Dielectric materials 515A and 515B can be gate oxide regions that separate (e.g., electrically separate) each of charge storage structure 202 and material 520 from material 510 (e.g., the channel region of transistor T1). Dielectric materials 515A and 515B can also separate (e.g., electrically separate) charge storage structure 202 from semiconductor material 596.

Example materials for dielectric materials 515A and 515B include silicon dioxide, hafnium oxide (e.g., $HfO_2$), aluminum oxide (e.g., $Al_2O_3$), or other dielectric materials. In an example structure of memory device 200, dielectric materials 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 7, the memory cells (e.g., memory cells 210, 211, 218 and 219) of memory device 200 can share (e.g., can electrically couple to) semiconductor material 596. For example, the read channel regions of the memory cells (e.g., material 510 of each of memory cells 210, 211, 218 and 219) of memory device 200 can contact (e.g., can be electrically coupled to) semiconductor material 596.

As shown in FIG. 5A and FIG. 5B, access line 241 can be adjacent part of material 510 and part of material 520 and can span across (e.g., overlap in the X-direction) part of material 510 and part of material 520. As described above, material 510 can form part of a read channel region of transistor T1 and material 520 can form part of a write channel region of transistor T2. Thus, as shown in FIG. 5A and FIG. 5B, access line 241 can span across (e.g., overlap) part of (e.g., on a side in the Y-direction) both read and write channel regions of transistors T1 and T2, respectively. As shown in FIG. 7, access line 241 can also span across (e.g., overlap in the X-direction) part of material 510 (e.g., a portion of the read channel region of transistor T1) and part of material 520 (e.g., a portion of write channel region of transistor T2) of other memory cells (e.g., memory cells 211, 218 and 219) of memory device 200. The spanning (e.g., overlapping) of access line 241 across material 510 and material 520 allows access line 241 (a single access line) to control (e.g., to turn on or turn off) both transistors T1 and T2 of memory cells 210, 211, 218 and 219.

As shown in FIG. 7, memory device 200 can include dielectric material (e.g., silicon dioxide) 526 that can form a structure (e.g., a dielectric) to electrically separate (e.g., isolate) parts of two adjacent (in the X-direction) memory cells of memory device 200. For example, dielectric material 526 between memory cells 210 and 211 can electrically separate material 520 (e.g., write channel region of transistor T2) of memory cell 210 from material 520 (e.g., write channel region of transistor T2) of memory cell 211, and electrically separate charge storage structure 202 of memory cell 210 from charge storage structure 202 of memory cell 211.

As shown in FIG. 7, memory device 200 can include dielectric portions 555. Material (e.g., read channel region) 510 of two adjacent memory cells (e.g., memory cells 211 and 218) can be electrically separated from each other by one of dielectric portions 555. Some portions (e.g., materials) of the memory cells of memory device 200 can be formed adjacent (e.g., formed on) a side wall (e.g., vertical portion with respect to the Z-direction) of a respective dielectric portion among dielectric portions 555. For example, as shown in FIG. 7, material 510 (e.g., semiconductor material portion) of memory cell 210 can be formed adjacent (e.g., formed on) a side wall (not labeled) of dielectric portion 555 (on the left of memory cell 210). In another example, material 510 (e.g., semiconductor material portion) of memory cell 211 can be formed adjacent (e.g., formed on) a side wall (not labeled) of dielectric portion 555 between memory cells 211 and 218.

As shown in FIG. 8, memory device 200 can include a dielectric material 518B (e.g., gate oxide region) to electrically separate portion access line 241 from other elements (e.g., from material 510, not shown in FIG. 8), charge storage structure 202, and material 520 of memory cell 210. Memory device 200 can also include a dielectric material 518F to separate memory cell 210 from an adjacent cell (e.g., memory cell 212 in FIG. 6A). The material (or materials) for dielectric material 518B can be the same as (or alternatively, different from) the material (or materials) of dielectric materials 515A and 515B. Example materials for dielectric material 518B can include silicon dioxide, hafnium oxide (e.g., $HfO_2$), aluminum oxide (e.g., $Al_2O_3$), or other dielectric materials. Dielectric material 518F can be the same as (or alternatively, different from) the material (or materials) of dielectric materials 518B.

The above description focuses on the structure of memory cell 210. Other memory cells (e.g., memory cells 211, 218 and 219 in FIG. 7) of memory device 200 can include elements structured in ways similar or the same as the elements of memory cell 210, described above. For example, as shown in FIG. 7, memory cell 211 can include charge storage structure 202, material (e.g., write channel region) 520, material 510 (e.g., read channel region), and dielectric materials 525A and 525B. The material (or materials) for dielectric materials 525A and 525B can be the same as the material (or materials) for dielectric materials 515A and 515B. Memory cells 218 and 219 can include elements structured in ways similar or the same as the elements of memory cells 210 and 211, respectively.

The following description describes data line 271. Other data lines (e.g., data lines 272, 273, and 274) of memory device 200 have similar structure and material as data line 271. As shown in FIG. 5A through FIG. 8, data line 271 (associated with signal BL1) can have a length in the Y-direction, a width in the X-direction, and a thickness in the Z-direction. Data line 271 can include a conductive material (or a combination of materials) that can be structured as a conductive line (e.g., conductive region) having a length in the Y-direction. Example materials for data line 271 include metal, conductively doped polysilicon, or other conductive materials. Other data lines 272, 273, and 274 (associated with signals BL2, BL3, and BL4, respectively) can have a length, a width, a thickness, and a material similar to or the same as data line 271. As shown in FIG. 6A and FIG. 7, data line 271 can contact (e.g., be directly coupled to) material 510 (e.g., read channel region) and contact (e.g., be directly coupled to) material 520 (e.g., write channel region) of memory cell 210. Similar, each of the other data lines (e.g., data lines 272, 273, and 274 in FIG. 7) can contact (e.g., be directly coupled to) material 510 and material 520 of a respective memory cell (e.g., memory cell 211, 218, or 219 in FIG. 7).

Figure 9A:
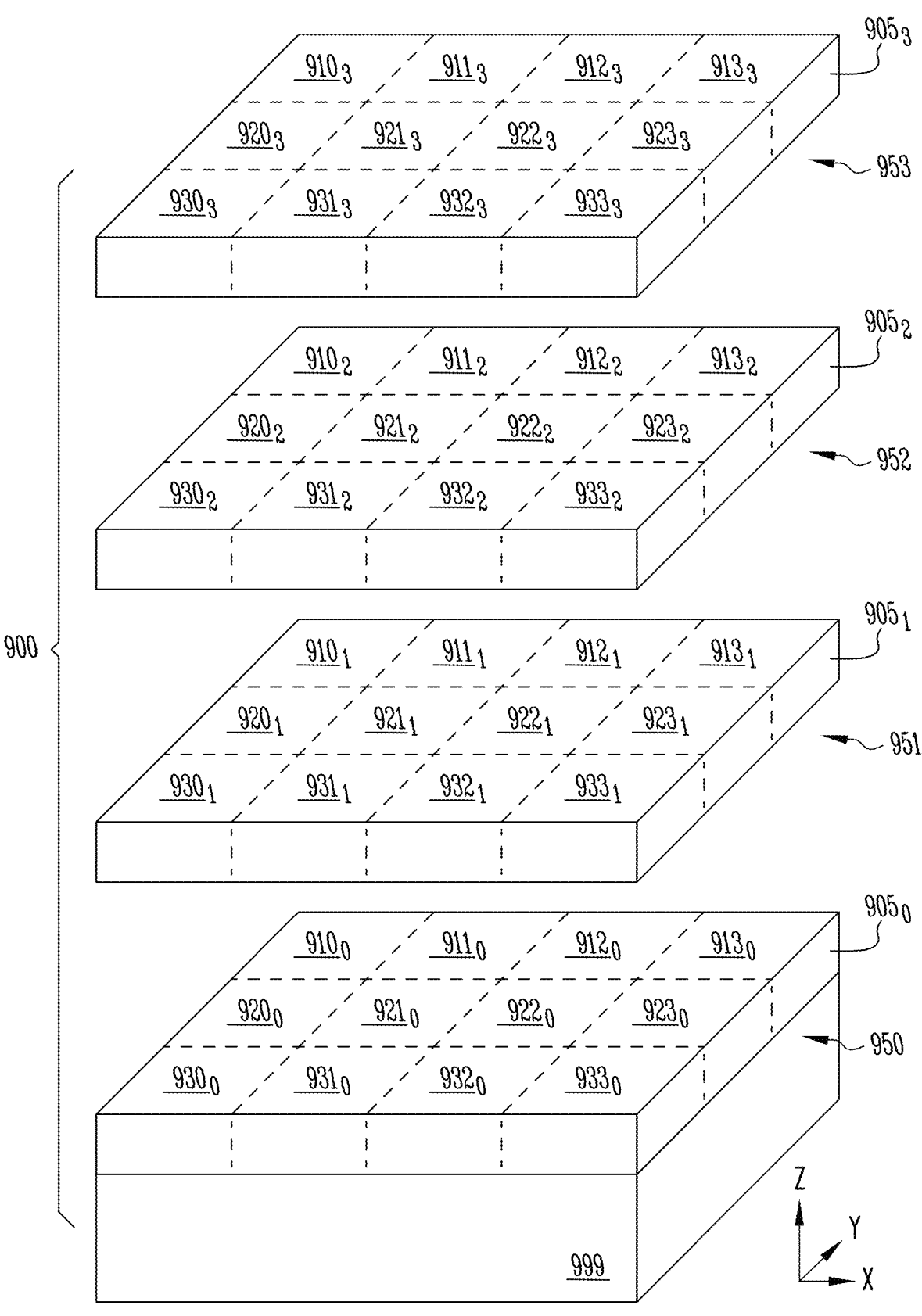

FIG. 9A, FIG. 9B, and FIG. 9C show different views of a structure of a memory device 900 including multiple decks of memory cells, according to some embodiments described herein. FIG. 9A shows an exploded view (e.g., in the Z-direction) of memory device 900. FIG. 9B shows a side view (e.g., cross-sectional view) in the X-direction and the Z-direction of memory device 900. FIG. 9C shows a side view (e.g., cross-sectional view) in the Y-direction and the Z-direction of memory device 900.

As shown in FIG. 9A, memory device 900 can include decks (decks of memory cells) $905_0$, $905_1$, $905_2$, and $905_3$ that are shown separately from each other in an exploded view to help ease of viewing the deck structure of memory device 900. In reality, decks $905_0$, $905_1$, $905_2$, and $905_3$ can be attached to each other in an arrangement where one deck can be formed (e.g., stacked) over another deck over a substrate (e.g., a semiconductor (e.g., silicon) substrate) 999. For example, as shown in FIG. 9A, decks $905_0$, $905_1$, $905_2$, and $905_3$ can be formed in the Z-direction perpendicular to substrate 999 (e.g., formed vertically in the Z-direction with respect to substrate 999).

As shown in FIG. 9A, each of decks $905_0$, $905_1$, $905_2$, and $905_3$ can have memory cells arranged in the X-direction and the Y-direction (e.g., arranged in rows in the X-direction and in columns in the Y-direction). For example, deck $905_0$ can include memory cells $910_0$, $911_0$, $912_0$, and $913_0$ (e.g., arranged in a row); memory cells $920_0$, $921_0$, $922_0$, and $923_0$ (e.g., arranged in a row); and memory cells $930_0$, $931_0$, $932_0$, and $933_0$ (e.g., arranged in a row). Deck $905_1$ can include memory cells $910_1$, $911_1$, $912_1$, and $913_1$ (e.g., arranged in a row); memory cells $920_1$, $921_1$, $922_1$, and $923_1$ (e.g., arranged in a row); and memory cells $930_1$, $931_1$, $932_1$, and $933_1$ (e.g., arranged in a row). Deck $905_2$ can include memory cells $910_2$, $911_2$, $912_2$, and $913_2$ (e.g., arranged in a row); memory cells $920_2$, $921_2$, $922_2$, and $923_2$ (e.g., arranged in a row); and memory cells $930_2$, $931_2$, $932_2$, and $933_2$ (e.g., arranged in a row). Deck $905_3$ can include memory cells $910_3$, $911_3$, $912_3$, and $913_3$ (e.g., arranged in a row); memory cells $920_3$, $921_3$, $922_3$, and $923_3$ (e.g., arranged in a row); and memory cells $930_3$, $931_3$, $932_3$, and $933_3$ (e.g., arranged in a row).

As shown in FIG. 9A, decks $905_0$, $905_1$, $905_2$, and $905_3$ can be located (e.g., formed vertically in the Z-direction) on levels (e.g., portions) 950, 951, 952, and 953, respectively, of memory device 900. The arrangement of decks $905_0$, $905_1$, $905_2$, and $905_3$ forms a 3-dimensional structure of memory cells of memory device 900 in that different levels of the memory cells of memory device 900 can be located (e.g., formed) in different levels (e.g., different vertical portions) 950, 951, 952, and 953 of memory device 900.

Decks $905_0$, $905_1$, $905_2$, and $905_3$ can be formed one deck at a time. For example, decks $905_0$, $905_1$, $905_2$, and $905_3$ can be formed sequentially in the order of decks $905_0$, $905_1$, $905_2$, and $905_3$ (e.g., deck $905_1$ is formed first and deck $905_3$ is formed last). In this example, the memory cell of one deck (e.g., deck $905_1$) can be formed either after formation of the memory cells of another deck (e.g., deck $905_0$) or before formation of the memory cells of another deck (e.g., deck $905_2$). Alternatively, decks $905_0$, $905_1$, $905_2$, and $905_3$ can be formed concurrently (e.g., simultaneously), such that the memory cells of decks $905_0$, $905_1$, $905_2$, and $905_3$ can be concurrently formed. For example, the memory cells in levels 950, 951, 952, and 953 of memory device 900 can be concurrently formed.

The structures of the memory cells of each of decks $905_0$, $905_1$, $905_2$, and $905_3$ can include the structures of the memory cells and memory arrays described above with reference to FIG. 1 through FIG. 8. For example, the structures of the memory cells of decks $905_0$, $905_1$, $905_2$, and $905_3$ can include the structure of respective memory cells of memory devices 100 and 200. Each of decks $905_0$, $905_1$, $905_2$, and $905_3$ can include a separate memory array (e.g., memory array $201_0$ or memory array $201_1$ in FIG. 2D). Alternatively, each of decks $905_0$, $905_1$, $905_2$, and $905_3$ can include multiple memory arrays (e.g., memory arrays $201_0$ and $201_1$ in FIG. 2D).

Memory device 900 can include data lines (e.g., bit lines) and access lines (e.g., word lines) to access the memory cells of decks $905_0$, $905_1$, $905_2$, and $905_3$. For simplicity, data lines and access lines of memory cells are omitted from FIG. 9A. However, the data lines and access lines of memory device 900 can be similar to the data lines and access lines, respectively, of the memory devices described above with reference to FIG. 1 through FIG. 8.

FIG. 9A shows memory device 900 including four decks (e.g., $905_0$, $905_1$, $905_2$, and $905_3$) as an example. However, the number of decks can be different from four. FIG. 9A shows each of decks $905_0$, $905_1$, $905_2$, and $905_3$ including one level (e.g., layer) of memory cells as an example. However, at least one of the decks (e.g., one or more of decks $905_0$, $905_1$, $905_2$, and $905_3$) can have two (or more) levels of memory cells. FIG. 9A shows an example where each of decks $905_0$, $905_1$, $905_2$, and $905_3$ includes four memory cells (e.g., in a row) in the X-direction and three memory cells (e.g., in a column) in the Y-direction. However, the number of memory cells in a row, in a column, or both, can vary.

The structure of memory device 200 as described above allows it to have a relatively smaller size (e.g., smaller footprint) and improved (e.g., reduced) power consumption (as a result of using a single access line (e.g., word line) to control two transistors of a corresponding memory cell) in comparison to some conventional memory devices.

Further, some conventional techniques may use CMOS based in an SRAM structure to obtain result similar to results SUM1+, SUM1−, SUM2+, SUM2−, SUMm+, and SUMm−. However, such conventional SRAM structure may have a relatively higher power consumption and area inefficiency.

In memory device 200, the structures the memory cells (e.g., as shown in FIG. 5A through FIG. 9C) of memory device 200 provide improvements and benefits over some conventional techniques. For example, the structures the memory cells of memory device 200 can provide a relatively higher performance and area efficiency (e.g., higher cell density) and a relatively lower cost memory device.

FIG. 10 is a flowchart for a method 1000 of obtaining multiply-accumulate information in a memory device, according to some embodiments described herein. Method 1000 can be performed by a memory device such as memory device 100 of FIG. 1 or memory device 200 (FIG. 2A through FIG. 8). At least part of method 1000 (e.g., part of method 1000 or the entire method 1000) can be performed (e.g., controlled) by a memory control unit of the memory device used in method 1000. Such a memory control unit can be similar to (or the same as) memory control unit 118 of FIG. 1. The memory control unit of the memory device used in method 1000 can be configured to include specific firmware, hardware, or software or any combination of firmware, hardware, and software to perform method 1000. As shown in FIG. 10, method 100 can include activities (e.g., operations) 1010, 1020, and 1030.

Activity 1010 can include obtaining multiply-accumulate information from a data line of a memory device (e.g., data line 271 in FIG. 4B or FIG. 4C). The information can be based at least in part on input information provided to an access line coupled to a gate of a transistor and a gate of an additional transistor of a memory cell coupled to the data line and based on weight information associated with a neural network.

Activity 1020 can include obtaining additional multiply-accumulate information from an additional data line of the memory device (e.g., data line 271 in FIG. 4B or FIG. 4C). The additional multiply-accumulate information can be based at least in part on additional input information provided to an additional access line coupled to a gate of a transistor and a gate of an additional transistor of a second memory cell coupled to the additional data line and based on additional weight information associated with the neural network.

Activity 1030 can include providing output information based on the first multiply-accumulate information and the additional multiply-accumulate information.

Method 1000 as described above can include fewer or more activities relative to the activities shown in FIG. 10. For example, method 1000 can include operations of memory device 200 described above with reference to FIG. 2A through FIG. 8 that are omitted from FIG. 10 for simplicity.

The illustrations of apparatuses (e.g., memory devices 100, 200, and 900) and methods (e.g., operations of memory devices 100 and 200, and method 1000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 900) or a system (e.g., an electronic item that can include any of memory devices 100, 200, and 900).

Any of the components described above with reference to FIG. 1 through FIG. 9C can be implemented in a number of ways, including simulation via software. Thus, apparatuses (e.g., memory devices 100, 200, and 900) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, and 900) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9C include apparatuses and methods of operating the apparatuses. One of the apparatuses includes a first memory cell and a second memory cell, each of the first and second memory cells including a first transistor including a first region and a first charge storage structure separated from the first region, a second transistor including a second region formed over the first charge storage structure; a first data line coupled to the first memory cell configured to provide a first sum based on current on the first data line during a memory operation; a second data line coupled to the second memory cell configured to provide a second sum based on current on the second data line during the memory operation; and an output circuit to provide output information based on values of the first and second sums. Other embodiments, including additional apparatuses and methods, are described.

In the detailed description and the claims, the terms "first," "second," and "third," etc. are used merely as labels, and are not intended to impose numerical requirements on their objects.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the term "adjacent" generally refers to a position of a thing being next to (e.g., either immediately next to or close to with one or more things between them) or adjoining another thing (e.g., abutting it or contacting it (e.g., directly coupled to) it).

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first memory cell including a first transistor and a second transistor, the first transistor including a first region and a first charge storage structure separated from the first region, the second transistor including a second region formed over the first charge storage structure, the first and second regions including materials of different conductivity types;
a second memory cell including a first additional transistor and a second additional transistor, the first additional transistor including a first additional region and a second charge storage structure separated from the first additional region, the second additional transistor including a second additional region formed over the second charge storage structure, the first and second additional regions including materials of different conductivity types;
a first data line coupled to the first memory cell configured to provide a first sum based on current on the first data line during a memory operation;
a second data line coupled to the second memory cell configured to provide a second sum based on current on the second data line during the memory operation; and
an output circuit to provide output information based on values of the first and second sums.

2. The apparatus of claim 1, further comprising:
a first conductive structure separated from the first region, the first charge storage structure, and the second region, the first conductive structure forming part of a gate of the first transistor and the second transistor; and
a second conductive structure separated from the first additional region, the second charge storage structure, and the second additional region, the second conductive structure forming part of a gate of the first additional transistor and the second additional transistor.

3. The apparatus of claim 1, wherein the first transistor and the first additional transistor are coupled to a common conductive structure.

4. The apparatus of claim 3, wherein the common conductive structure is coupled to a ground connection of the apparatus.

5. The apparatus of claim 1, wherein:
the first region includes a channel region of the first transistor, and the second region includes a channel region of the second transistor; and
the first additional region includes a channel region of the first additional transistor, and the second additional region includes a channel region of the second additional transistor.

6. The apparatus of claim 1, wherein:
the first data line is coupled to the first region and the second region; and the second data line is coupled to the first additional region and the second additional region.

7. The apparatus of claim 1, wherein each of the first region and the first additional region includes a semiconductor material.

8. The apparatus of claim 1, wherein each of the second region and the second additional region includes a semiconducting oxide material.

9. The apparatus of claim 1, wherein the apparatus comprises a memory device, the first memory cell is included in a first memory array, and the second memory cell is included in a second memory array of the memory device.

10. The apparatus of claim 1, wherein the apparatus comprises a memory device, the first memory cell is included in a first deck of memory cells of the memory device, and the second memory cell is included in a second deck of the memory device, and the first deck of memory cells and the second deck of memory cells are located in different levels of the memory device.

11. An apparatus comprising:
a first memory cell including a first transistor and a second transistor, the first transistor including a first region and a first charge storage structure separated from the first region, the second transistor including a second region formed over the first charge storage structure, the first and second regions including materials of different conductivity types;
a second memory cell including a first additional transistor and a second additional transistor, the first additional transistor including a first additional region and a second charge storage structure separated from the first additional region, the second additional transistor including a second additional region formed over the second charge storage structure, the first and second additional regions including materials of different conductivity types; and
a memory control unit including circuitry configured to operate on the first and second memory cells to obtain multiply-accumulate information based on input information provided to access lines coupled to the first and second memory cells and weight information stored in the first and second memory cells.

12. The apparatus of claim 11, wherein the memory control unit is configured to accumulate the information based on a first result of a first multiply-accumulate information and a second result of a second multiply-accumulate information, wherein the first multiply-accumulate information is provided from a first data line coupled to the first memory cell, and the second multiply-accumulate information is provided from a second data line coupled to the second memory cell.

13. The apparatus of claim 11, wherein the weight information is binary coded weight information.

14. The apparatus of claim 11, wherein each of the first region and the first additional region includes polysilicon, and each of the second region and the second additional region includes a semiconducting oxide material.

15. The apparatus of claim 11, wherein each of the first region and the first additional region includes a polysilicon, and each of the second region and the second additional region includes a semiconducting oxide material.

16. The apparatus of claim 11, wherein each of the first region and the first additional region includes a p-type conductivity material, and each of the second region and the second additional region includes an n-type conductivity material.

17. The apparatus of claim 11, wherein each of the second region and the second additional region includes at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

18. A method comprising:
obtaining first multiply-accumulate information from a first data line of a memory device, the first multiply-accumulate information based at least in part on first input information provided to a first access line coupled to a gate of a first transistor and a gate of second transistor of a first memory cell coupled to the first data line and based on first weight information associated with a neural network;

obtaining second multiply-accumulate information from a second data line of the memory device, the second multiply-accumulate information based at least in part on second input information provided to a second access line coupled to a gate of a first transistor and a gate of second transistor of a second memory cell coupled to the second data line and based on second weight information associated with the neural network; and providing output information based on the first multiply-accumulate information and the second multiply-accumulate information.

19. The method of claim 18, wherein providing the output information includes subtracting the second multiply-accumulate information from the first multiply-accumulate information such that the output information has a value based on a result of the second multiply-accumulate information subtracted from the first multiply-accumulate information.

20. The method of claim 19, wherein providing the output information further includes converting an analog value of the result into a digital value, such that the output information is a digital information.

* * * * *